(12) United States Patent
Hetzer et al.

(10) Patent No.: US 8,664,954 B2
(45) Date of Patent: Mar. 4, 2014

(54) MAGNETIC RESONANCE IMAGING WITH IMPROVED IMAGING CONTRAST

(75) Inventors: Stefan Hetzer, Leipzig (DE); Toralf Mildner, Leipzig (DE); Harald Moeller, Leipzig (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 326 days.

(21) Appl. No.: 13/257,091

(22) PCT Filed: Mar. 31, 2009

(86) PCT No.: PCT/EP2009/002345
§ 371 (c)(1), (2), (4) Date: Sep. 16, 2011

(87) PCT Pub. No.: WO2010/112039
PCT Pub. Date: Oct. 7, 2010

(65) Prior Publication Data
US 2012/0013336 A1  Jan. 19, 2012

(51) Int. Cl.
*G01V 3/00* (2006.01)
(52) U.S. Cl.
USPC .......................................... 324/309; 324/318
(58) Field of Classification Search
USPC ........................ 324/300–322; 600/407–445
See application file for complete search history.

(56) References Cited

U.S. PATENT DOCUMENTS

| | | | |
|---|---|---|---|
| 4,767,991 A | 8/1988 | Rzedzian | |
| 5,957,843 A | 9/1999 | Luk Pat et al. | |
| 6,320,380 B1 * | 11/2001 | Wu et al. | 324/309 |
| 6,700,374 B1 * | 3/2004 | Wu et al. | 324/312 |
| 7,081,751 B2 * | 7/2006 | Twieg | 324/310 |
| 7,941,204 B1 * | 5/2011 | Wang et al. | 600/420 |
| 2011/0044524 A1 * | 2/2011 | Wang et al. | 382/131 |
| 2012/0245453 A1 * | 9/2012 | Tryggestad et al. | 600/413 |
| 2013/0211239 A1 * | 8/2013 | Wang et al. | 600/420 |

OTHER PUBLICATIONS

Barbier et al., "Methodolgy of Brain Perfusion Imaging", Journal of Magnetic Resonance Imaging, vol. 13, pp. 496-520 (2001).
Bernstein et al., "Handbook of MRI Pulse Sequences", pp. 702-739 (2004).

(Continued)

*Primary Examiner* — Brij Shrivastav
(74) *Attorney, Agent, or Firm* — Caesar, Rivise, Bernstein, Cohen & Pokotilow, Ltd.

(57) ABSTRACT

A method of magnetic resonance imaging of an object comprises the steps of arranging the object in a stationary magnetic field, subjecting the object to an excitation and encoding sequence of magnetic field gradients resulting in k-space sampling in two segments along the phase encoding direction, wherein the encoding sequence of the magnetic field gradients is selected such that the two segments in k-space are sampled along trajectories beginning with a central k-space line through the k-space center and continuing to opposite k-space borders of the two segments, collecting magnetic resonance signals created in the object, and reconstructing an image of the object based on the magnetic resonance signals, wherein one central k-space line is sampled in both of the two k-space segments, and intersegment phase and/or intensity deviations are corrected in both k-space segments using the magnetic resonance signals collected along the central k-space line. Furthermore, an imaging device for magnetic resonance imaging of an object is described.

20 Claims, 15 Drawing Sheets

(56) References Cited

OTHER PUBLICATIONS

Butts et al., "Interleaved Echo Planar Imaging on a Standard MRI System", Magnetic Resonance in Medicine, vol. 31, pp. 67-72 (1994).

Calamante et al., "Measuring Cerebral Blood Flow Using Magnetic Resonance Imaging Techniques", Journal of Cerebral Blood Flow and Metabolism, vol. 19, pp. 701-735 (1999).

Chapman et al., "Real-Time Movie Imaging from a Single Cardiac Cycle by NMR", Magnetic Resonance in Medicine, vol. 5, pp. 246-254 (1987).

Chen et al., "Correction for EPI Distortions Using Multi-Echo Graident-Echo Imaging", Magnetic Resonance in Medicine, vol. 41, pp. 1206-1213 (1999).

Chen et al., "Improved Imaging Reconstruction for Partial Fourier Gradient-Echo Echo-Planar Imaging (EPI)", Magnetic Resonance in Medicine, vol. 59, pp. 916-924 (2008).

Cohen et al., "Ultra-Fast Imaging", Magnetic Resonance Imaging, vol. 9, pp. 1-37 (1991).

Doyle et al., "Real-Time Cardiac Imaging of Adults at Video Frame Rates by Magnetic Resonance Imaging", The Lancet, p. 682 (1986).

Farzaneh et al., "View-Interleaved EPI on a Commercial Scanner", Proceedings of the 8th Annual Meeting of the Society of Magnetic Resonance in Medicine, Amsterdam, The Netherlands, p. 832 (1989).

Finsterbusch, "Eddy-Current Compensated Diffusion Weighting with a Single Refocusing RF Pulse", Magnetic Resonance in Medicine, vol. 61, pp. 748-754 (2009).

Fischer et al., "Echo-Planar Imaging Image Artifacts", Echo-Planar Imaging: Theory, Technique and Application, pp. 179-200 (1998).

Glover et al., "Projection—Reconstruction in MRI", Encyclopedia of Nuclear Magnetic Resonance, vol. 8, pp. 3772-3778 (1996).

Guilfoyle et al., "Interleaved snapshot echo planar imaging of mouse brain at 7.0T", NMR Biomed., vol. 19, pp. 108-115 (2006).

Haase, "Snapshot Flash MRI. Applications to T1, T2 and Chemical-Shift Imaging", Magnetic Resonance in Medicine, vol. 13, pp. 77-89 (1990).

Hetzer et al., "A Modified EPI Sequence for High-Resolution Imaging at Ultra-Short Echo Times", Proc. Intl. Soc. Mag. Reson. Med., vol. 17, p. 2663 (2009).

Hetzer, "High-Resolution Echo-Planar Imaging at Ultra-Short Echo Times", Abstract of Institutskolloquium dated Jan. 13, 2009.

Hyde et al., "High-Resolution fMRI Using Multislice Partial k-Space GR-EPI with Cubic Voxels", Magnetic Resonance in Medicine, vol. 46, pp. 114-125 (2001).

Jesmanowicz, et al., "Single-Shot Half k-Space High-Resolution Gradient-Recalled EPI for fMRI at 3 Tesla", Magnetic Resonance in Medicine, vol. 40, pp. 754-762 (1998).

Jezzard, "Effects of B0 Magnetic Field Drift on Echo Planar Functional Magnetic Resonance Imaging", Proceedings of the 4th Annual Meeting of ISMRM, p. 1817 (1996).

Kim et al., "Fast Interleaved Echo-Planar Imaging with Navigator: High Resolution Anatomic and Functional Images at 4 Tesla", Magnetic Resonance in Medicine, vol. 35, pp. 895-902 (1996).

Krueger et al., "Neuroimaging at 1.5 T and 3.0 T: Comparison of Oxygenation-Sensitive Magnetic Resonance Imaging", Magnetic Resonance in Medicine, vol. 45, pp. 595-604 (2001).

Luk Pat et al., "Reducing Flow Artifacts in Echo-Planar Imaging", Magnetic Resonance in Medicine, vol. 37, pp. 436-447 (1997).

Man et al., "Multifrequency Interpolation for Fast Off-resonance Correction", Magnetic Resonance in Medicine, vol. 37, pp. 785-792 (1997).

Mansfield, "Multi-planar image formation using NMR spin echoes", J. Phys. C: Solid State Phys., vol. 10, pp. L55-L58 (1977).

Mansfield, "Spatial Mapping of the Chemical Shift in NMR", Magnetic Resonance in Medicine, vol. 1, pp. 370-386 (1984).

McKinnon, "Ultrafast Interleaved Gradient-Echo-Planar Imaging on a Standard Scanner", Magnetic Resonance in Medicine, vol. 30, pp. 609-616 (1993).

Noll et al., "A Homogeneity Correction Method for Magnetic Resonance Imaging with Time-Varying Gradients", IEEE Transactions on Medical Imaging, vol. 10, No. 4, pp. 629-637 (1991).

Reese et al., "Reduction of Eddy-Current-Induced Distortion in Diffusion MRI Using a Twice-Refocused Spin Echo", Magnetic Resonance in Medicine, vol. 49, pp. 177-182 (2003).

Robson et al, "Diffusion-Weighted Multiple Shot Echo Planar Imaging of Humans without Navigation", Magnetic Resonance in Medicine, vol. 38, pp. 82-88 (1997).

Schmithorst et al., "Simultaneous Correction of Ghost and Geometric Distortion Artifacts in EPI Using a Multiecho Reference Scan", IEEE Transactions on Medical Imaging, vol. 20, No. 6, pp. 535-539 (2001).

Schmitt et al., "Echo-Planar Image Reconstruction", Echo-Planar Imaging: Theory, Technique and Application, pp. 141-178 (1998).

Stehling et al., Inversion-Recovery Echo-Planar Imaging (IR-EPI) at 0.5T, Magnetic Resonance in Medicine, vol. 13, pp. 514-517 (1990).

Wansapura et al, "NMR Relaxation Times in the Human Brain at 3.0 Tesla", Journal of Magnetic Resonance Imaging, vol. 9, pp. 531-538 (1999).

Wielopolski et al., "Echo-Planar Imaging Pulse Sequences", in "Echo-Planar Imaging: Theory, Technique and Application," pp. 65-139 (Schmitt et al. eds., Spinger, 1998).

Xu et al., "An iterative reconstruction technique for geometric distortion-corrected segmented echo-planar imaging" Magnetic Resonance Imaging, vol. 26, Issue 10, Dec. 2008, pp. 1406-1414.

International Search Report for PCT/EP2009/002345 dated Jun. 18, 2010.

* cited by examiner

MAGNETIC RESONANCE IMAGING WITH IMPROVED IMAGING CONTRAST

TECHNICAL FIELD

The present invention relates to a method of magnetic resonance (MR) imaging of an object, in particular to an MR imaging (MRI) method with improved imaging contrast and/or shortened acquisition time. Furthermore, the invention relates to an MRI device adapted for implementing the MRI method. Preferred applications of the invention are in the field of biomedical MRI.

TECHNICAL BACKGROUND OF THE INVENTION

In the present specification, reference is made to the following publications cited for illustrating prior art techniques and conventional implementations of certain procedural measures or partial aspects of excitation and encoding sequences.
[1] P. Mansfield. Multi-planar image formation using NMR spin echoes. J. Phys. C: Solid State Phys. 10: L55-L58 (1977).
[2] H. Fischer, R. Ladebeck. Echo planar imaging image artifacts. In: F. Schmitt, M. K. Stehling, R. Turner, eds. Echo-Planar Imaging: Theory, Technique and Application. Springer, Berlin (1998); pp. 179-200.
[3] M. A. Bernstein, K. F. King, X. J. Zhou. Handbook of MRI Pulse Sequences. Elsevier Academic Press, Burlington, Mass. (2004); pp. 702-739.
[4] M. Doyle, R. Turner, M. Cawley, P. Glover, G. K. Morris, B. Chapman, R. J. Ordidge, R. Coxon, R. E. Coupland, B. S. Worthington, P. Mansfield. Real-time cardiac imaging of adults at video frame rates by magnetic-resonance imaging. Lancet 328(8508): 682 (1986).
[5] B. Chapman, R. Turner, R. J. Ordidge, M. Doyle, M. Cawley, R. Coxon, P. Glover, A. Mansfield. Real-time movie imaging from a single cardiac cycle by NMR. Magn. Reson. Med. 5: 246-254 (1987).
[6] M. S. Cohen, R. M. Weisskoff. Ultra-fast imaging. Magn. Reson. Imaging 9: 1-37 (1991).
[7] J. P. Wansapura, S. K. Holland, R. S. Dunn, W. S. Ball. NMR relaxation times in the human brain at 3.0 Tesla. J. Magn. Reson. Imaging 9: 351-358 (1999).
[8] A. Jesmanowicz, P. A. Bandettini, J. S. Hyde. Single-shot half k-space high-resolution gradient-recalled EPI for fMRI at 3 Tesla. Magn. Reson. Med. 40: 754-762 (1998).
[9] J. S. Hyde, B. B. Biswal, A. Jesmanowicz. High-resolution fMRI using multislice partial k-space GR-EPI with cubic voxels. Magn. Reson. Med. 46: 114-125 (2001).
[10] N. K. Chen, K. Oshio, L. P. Panych. Improved image reconstruction for partial Fourier gradient-echo echo-planar imaging (EPI). Magn. Reson. Med. 59: 916-924 (2008).
[11] P. A. Wielopolski, F. Schmitt, M. K. Stehling. Echo-planar imaging pulse sequences. In: F. Schmitt, M. K. Stehling, R. Turner, eds. Echo-Planar Imaging: Theory, Technique and Application. Springer, Berlin, (1998); pp. 65-139.
[12] R. R. Rzedzian. Method of high speed imaging with improved spatial resolution using partial k-space acquisitions. U.S. Pat. No. 4,767,991 (1988).
[13] M. D. Robson, A. W. Anderson, J. C. Gore. Diffusion-weighted multiple shot echo planar imaging of humans without navigation. Magn. Reson. Med. 38: 82-88 (1997).
[14] S. G. Kim, X. Hu, G. Adriany, K. Ugurbil. Fast interleaved echo-planar imaging with navigator: high resolution anatomic and functional images at 4 Tesla. Magn. Reson. Med. 35: 895-902 (1996).
[15] G. T. Luk Pat, C. H. Meyer, J. M. Pauly, D. G. Nishimura. Reducing flow artifacts in echo-planar imaging. Magn. Reson. Med. 37: 436-447 (1997).
[16] G. T. Luk Pat, C. H. Meyer, J. M. Pauly, D. G. Nishimura. Partial flyback echo-planar imaging. U.S. Pat. No. 5,957,843 (1999).
[17] F. Farzaneh, S. J. Riederer, J. K. Maier, R. Vavrek. View-interleaved EPI on a commercial scanner. Proceedings of the 8$^{th}$ Annual Meeting of the Society of Magnetic Resonance in Medicine, Amsterdam, The Netherlands; p. 832 (1989).
[18] G. C. McKinnon. Ultrafast interleaved gradient-echo-planar imaging on a standard scanner. Magn. Reson. Med. 30: 609-616 (1993).
[19] K. Butts, S. J. Riederer, R. L. Ehman, C. R. Jack. Interleaved echo planar imaging on a standard MRI system. Magn. Reson. Med. 31: 67-72 (1994).
[20] P. Mansfield. Spatial mapping of the chemical shift in NMR. Magn. Reson. Med. 1: 370-386 (1984).
[21] F. Schmitt, P. A. Wielopolski. Echo-planar image reconstruction. In: F. Schmitt, M. K. Stehling, R. Turner, eds. Echo-Planar Imaging Theory, Technique and Application. Springer, Berlin (1998); pp. 141-178.
[22] P. Jezzard. Effects of $B_0$ magnetic field drift on echo planar functional magnetic resonance imaging. In Proceedings of the 4th Annual Meeting of ISMRM, New York, N.Y., USA (1996), p. 1817.
[23] D. C. Noll, C. H. Meyer, J. M. Pauly, D. G. Nishimura, A. Macovski. A homogeneity correction method for magnetic resonance imaging with time-varying gradients. IEEE Trans. Med. Imaging 10: 629-637 (1991).
[24] L. C. Man, J. M. Pauly, A. Macovski. Multifrequency interpolation for fast off-resonance correction. Magn. Reson. Med. 37: 785-792 (1997).
[25] N. K. Chen, A. M. Wyrwicz. Correction for EPI distortions using multi-echo gradient-echo imaging. Magn. Reson. Med. 41: 1206-1213 (1999).
[26] V. J. Schmithorst, B. J. Dardzinski, S. K. Holland. Simultaneous correction of ghost and geometric distortion artifacts in EPI using a multiecho reference scan. IEEE Trans. Med. Imaging. 20: 535-539 (2001).
[27] G. Kruger, A. Kastrup, G. H. Glover. Neuroimaging at 1.5 T and 3.0 T: Comparison of oxygenation-sensitive magnetic resonance imaging. Magn. Reson. Med. 45: 595-604 (2001).
[28] D. N. Guilfoyle, J. Hrabe. Interleaved snapshot echo planar imaging of mouse brain at 7.0 T. NMR Biomed. 19: 108-115 (2006).
[29] G. H. Glover, J. M. Pauly. Projection-reconstruction in MRI. In: D. M. Grant, R. K. Harris (eds.). Encyclopedia of Nuclear Magnetic Resonance. Vol. 8. Wiley, Chichester (1996), p. 3772-3778.
[30] M. K. Stehling, R. J. Ordidge, R. Coxton, P. Mansfield. Inversion-recovery echo-planar imaging (IR-EPI) at 0.5 T. Magn. Reson. Med. 13: 514-517 (1990).
[31] A. Haase. Snapshot FLASH MRI. Applications to T1, T2, and chemical-shift imaging. Magn. Reson. Med. 13: 77-89 (1990).
[32] T. O. Reese, O. Heid, R. M. Weisskoff, V. J. Wedeen. Reduction of eddy-current-induced distortion in diffusion MRI using a twice-refocused spin echo. Magn. Reson. Med. 49: 177-183 (2003).
[33] J. Finsterbusch. Eddy-current compensated diffusion weighting with a single refocusing RF pulse. Magn. Reson. Med. 61: 748-754 (2009).

[34] F. Calamante, D. L. Thomas, G. S. Pell, J. Wiersma, R. Turner. Measuring cerebral blood flow using magnetic resonance imaging techniques. J. Cereb. Blood Flow Metab. 19: 701-735 (1999).

[35] E. L. Barbier, L. Lamalle, M. Décorps. Methodology of brain perfusion imaging. J. Magn. Reson. Imaging 13: 496-520 (2001).

Echo-planar imaging (EPI), first proposed by Mansfield [1] is among the fastest MRI pulse excitation sequences permitting the acquisition of so-called k-space data for a single image in a few tens of milliseconds. The k-space represents the reciprocal lattice space. Due to the high speed, EPI has permitted a number of important imaging techniques, in particular functional brain mapping, perfusion imaging, diffusion imaging, or cardiac imaging. On the other hand, EPI is also prone to a variety of image artifacts (e.g., Nyquist ghosting, chemical shift displacements, distortions and signal voids arising from magnetic susceptibility variations across the object, image blurring due to effective transverse relaxation during the EPI readout), and the resolution is typically limited to more than a millimeter for human applications [2, 3].

Conventional single-shot gradient-echo EPI produces a series of gradient echoes with a bipolar oscillating readout gradient scheme following a radiofrequency (RF) excitation pulse. Each gradient echo is individually phase-encoded by a phase blip [4-6] so that multiple k-space lines are recorded to produce a full (typically two-dimensional, 2D) image in a single-shot fashion. The number of gradient echoes, $N_{etl}$, is also referred to as the echo-train length, and the interval between two adjacent echoes is referred to as echo spacing, $t_{es}$ [3]. Along the direction of phase-encoding, each echo n is encoded at a different echo time, TE(n) resulting in decaying signal amplitudes according to $$S(n) = S_0 \exp\left[-\frac{TE(n)}{T_2^*}\right] \quad (1)$$

where $S_0$ would be the amplitude of the signal recorded at TE=0, and $T_2^*$ is the effective transverse relaxation time. Image contrast is predominantly determined by the echo time, $TE_{eff}$, of the central k-space line. As k-space is sampled from the bottom to the top (alternatively from top to bottom) in conventional blipped EPI methods, this leads to $TE_{eff}=TE$ ($N_{etl}/2$). Assuming a trapezoidal gradient waveform and data acquisition only during the plateaus of the trapezoids, a gradient system with a maximal amplitude of 45 mT/m and a maximal slew rate of 150 T/m/s, a receiver bandwidth of ±75 kHz (i.e., a dwell time of 6.7 μs), a field of view of 20 cm, and an acquisition matrix of 128×128, the acquisition time for a single echo is $T_{acq}\approx 0.853$ ms, and the minimal echo spacing is $t_{es}=1.088$ ms. The effective echo time would then be $$TE_{eff} = t_{del} + t_{es}\frac{N_{etl} - 1}{2} \approx 70.6 \text{ ms} \quad (2)$$

where we have assumed another delay, $t_{del}=1.5$ ms, between the RF pulse and the beginning of data acquisition of the first echo. In human brain tissue at 3 T, a typical relaxation time is $T_2^*\approx 45$ ms [7], that is, the image suffers a reduction in the signal-to-noise ratio (SNR) by 79% due to relaxation between excitation of the spin system and detection of the central k-space line carrying the majority of k-space energy. With ramp sampling (i.e., acquiring k-space data during the entire trapezoidal gradient lobe), the minimal echo spacing and effective echo time may be reduced to $t_{es}=0.853$ ms and $TE_{eff}\approx 55.7$ ms, respectively, however, the SNR loss is still 71%. Unless $T_2^*$ relaxation is the wanted contrast mechanism, as for example in functional brain mapping based on the blood oxygen level dependent (BOLD) effect, this intrinsic signal loss causes problems in the application of EPI for anatomical imaging and seriously limits the implementation of high-resolution EPI techniques.

For achieving short effective echo times in single-shot EPI, partial k-space acquisition is often employed along the phase-encoding direction [6, 8, 9]. It relies on the symmetry properties of k-space, specifically, the fact that the Fourier transform of a real object is Hermitian. In practice, however, additional overscan lines are commonly sampled to correct for unwanted phase shifts and to avoid signal dropout induced by magnetic-susceptibility variations in phase-encoding direction. This loss of signal contributions in k-space cannot be recovered by post-processing strategies [10]. The effective echo time for partial k-space acquisition can be reduced to $$TE_{eff} = t_{del} + t_{es} \times N_{ol} \quad (3)$$

where $N_{ol}$ is the number of overscan lines (typically between 8 and 16).

Multi-shot EPI techniques acquire fractions of the k-space data with the echo trains produced by multiple RF excitations [3, 11, 12]. In mosaic EPI, data are acquired as a series of tiles and concatenated prior to image reconstruction [6, 12, 13]. Each tile is acquired within a single echo train, and its position is controlled by adjusting the prephasing gradient area and the polarities of the readout gradient waveform and the phase blips. The major problem is that different phase errors are contained in each tile leading to data inconsistency and image artifacts. The lack of sufficient robustness has so far limited the routine use of mosaic EPI [3, 11]. To correct for such phase errors, overscan lines as in partial k-space acquisition are acquired for the estimation of the phase inconsistencies from the overlapping data. Minimal effective echo times are achieved by reversing the polarity of the phase blips in segmented acquisition schemes to obtain center-out trajectories [14-16]. This also ensures that signal contributions, which are shifted out of the acquisition window for one segment due to variations of the magnetic susceptibility, are recorded during the acquisition of another segment. Signal dropouts due to echo shifting can thus be avoided without overscan lines. Additional navigator lines are measured for correcting intersegment phase and intensity discontinuities [14]. As another consequence of combining segments measured with opposite phase-encoding directions, image distortions due to magnetic field inhomogeneities unfold in opposite directions along the phase-encoding axis. This artifact can be corrected in the Fourier domain if the distribution of the static magnetic field is precisely known, e.g. from a separate field-mapping scan. In previous applications, however, the accuracy of the field-mapping scan was rather low [15, 16] or distortions were even completely ignored [14], which only permits imaging at rather low resolution.

In interleaved multishot EPI [5, 12, 17-19], the phase-encoding amplitudes of the blip areas are increased so that the gap between k-space lines acquired within one echo train is also increased. The k-space lines from the subsequent excitations are placed to fill up the gaps in an interleaved fashion. Due to the shortened echo-train length, this achieves less $T_2^*$ decay during data acquisition according to Eq. (1) and, hence, increased SNR, reduced image blurring, and an increased effective bandwidth (i.e., reduced chemical-shift displacements and image distortions). Such advantages come at the expense of an increased scan time (linear increase with the number of interleaves) and susceptibility to motion artifacts.

OBJECTIVE OF THE INVENTION

It is an objective of the present invention to provide an improved MR imaging method, which is capable of avoiding disadvantages of the conventional techniques. In particular, it is an objective of the invention to provide the MR imaging method with improved imaging contrast and/or SNR, shortened acquisition time and/or improved applications in medical imaging. Furthermore, the objective of the invention is to provide an improved MR imaging device avoiding disadvantages of conventional MR imaging devices.

These objectives are solved with methods and devices as defined in the independent claims. Advantageous embodiments and applications of the invention are defined in the dependent claims.

SUMMARY OF THE INVENTION

According to a first aspect of the invention, a method of magnetic resonance imaging of an object comprises the steps of subjecting the object in a stationary magnetic field to an excitation and encoding sequence of magnetic field gradients, collecting magnetic resonance signals created in the object in response to the excitation and encoding sequence and reconstructing at least one image of the object based on the magnetic resonance signals. The excitation and encoding sequence results in k-space sampling in two segments along the phase encoding direction. For the excitation, the excitation and encoding sequence comprises two RF excitation pulses. The two segments in k-space are sampled along trajectories beginning with a central k-space line through the k-space center and continuing towards the outer sides of the k-space, in particular to opposite borders of the two segments. According to the invention, the encoding sequence of magnetic field gradients is constructed such that one single central k-space line is sampled in both of the two k-space segments. Advantageously, this provides intrinsic information on mutual phase and/or in tensity relationships of the magnetic resonance signals in both k-space segments without the need to acquire additional navigator signals. Furthermore, according to the invention, the magnetic resonance signals collected along the central k-space line in each k-space segment are utilized for correcting intersegment phase and/or intensity deviations in both k-space segments.

According to a second aspect of the invention, an imaging device for MRI of an object is provided, which comprises a main magnetic device arranged for creating a stationary magnetic field, a gradient device arranged for generating an encoding sequence of magnetic field gradients resulting in the k-space sampling in two segments along the phase-encoding direction, a transmitter device arranged for creating excitation pulses, a receiver device arranged for collecting resonance signals created in the object, a control device arranged for controlling the gradient device and the transmitter device, and an image reconstructing circuit arranged for reconstructing an image of the object based on the MR signals. The control device is adapted for creating the encoding sequence of the magnetic field gradients such that the two segments in k-space are sampled along trajectories beginning with a line through the k-space center (central k-space line) and continuing to opposite k-space borders of the two segments. According to the invention, the control device is adapted for controlling the gradient device such that one single central k-space line is sampled in both of the two k-space segments. Furthermore, according to the invention, the image reconstructing circuit is adapted for correcting intersegment phase and/or intensity deviations using the MR signals collected along each central k-space line.

The inventive technique comprises a double-shot echoplanar imaging with center-out trajectories and intrinsic navigation (also called: DEPICTING) for the real-time sampling of the k-space with improved capabilities for achieving maximal SNR and high image quality. The basic concept consists of a segmented EPI pulse sequence during which k-space is sampled in the two tiles along the phase-encoding direction. By contrast to conventional strategies for segmented EPI (see e.g. publications [5, 12]), sampling of the full k-space data is performed in real time, that is, the total acquisition time is increased by only less than 10% with respect to non-segmented single-shot EPI. Another major improvement compared to strategies proposed in the past is the inherent ability to omit overlapping of adjacent parts of k-space besides the central k-space line. Correaction of phase or intensity deviations between the two tiles is performed by comparing the data from the two k-space center lines, which are acquired without a prephasing gradient.

Another significant advantage resulting from the center-out sampling trajectories is the superior point-spread function in phase-encoding direction (see e.g. publications [8, 9]), which is again of additional benefit for high-resolution imaging.

According to a preferred embodiment of the invention, the two corrected central k-space lines are preferably averaged for image reconstruction, yielding a single new central k-space line with improved SNR of the corrected full k-space data set. The image of the object is reconstructed from the data in both k-space segments utilizing the common central k-space line signals. This approach achieves minimal $TE_{eff}$ combined with a robust Cartesian k-space sampling strategy, which is of specific advantage for high-resolution applications due to the substantial gain in SNR.

According to a further preferred embodiment of the invention, a multi-echo field-map scan is provided for estimating a distribution of the magnetic field across the object, and off-resonance frequencies in the k-space are removed based on this distribution of the magnetic field across the object. Advantageously, artifacts induced by inhomogeneities in the static main magnetic field can be inherently corrected. Preferably, the multi-echo field-map scan is acquired with identical gradient strengths and bandwidths as employed for the inventive encoding sequence of magnetic field gradients resulting in the k-space sampling in the two segments. Thus, field mapping is performed with similar conditions like the DEPICTING sequence. Alternatively, field mapping can be performed with deviating gradient strengths and bandwidths, in particular if the imaging device is adapted for eddy current suppression.

Preferably, each trajectory of the inventive sampling procedure begins without delay or, in terms of switching characteristics of the gradient and transmitter devices, with minimum delay at the k-space center (i.e., a center-out trajectory). Advantageously, the one segment in k-space is sampled after completion of the previous segment with a time delay which is set to be smaller than 100 ms, preferably smaller that 10 ms, in particular smaller than 5 ms, like e.g. 2 ms or below.

Furthermore, the time delay between the two excitation pulses of the DEPICTING sequence can be selected in dependence on the imaging conditions, in particular in dependence on the selected size of the k-space and bandwidth.

According to a further preferred embodiment of the invention, a plurality of pairs of segments can be consecutively collected. The steps of k-space sampling in the varying segments and collecting MR signals can be performed with a whole number of $N_{tiles}$ repetitions. Thus, a plurality of images of the object can be reconstructed based on the collected MR signals. The object images represent a time-dependent image sequence. Preferably, pairwise combining magnetic resonance signals collected in directly consecutive k-space segments is provided. With this embodiment, a total of $N_{tiles}-1$ images can be reconstructed from the combined full k-space data of tiles 1 and 2, tiles 2 and 3, tiles 3 and 4, etc. up to tiles $N_{tiles}-1$ and $N_{tiles}$, resp.

According to a first variant of the inventive collection of image sequence, the excitation pulses of each k-space sampling step have identical flip angles ($\alpha_n$). In this case, advantages in terms of simple control of the excitation pulses can be obtained. Alternatively, according to a second variant, the excitation pulses of the consecutive k-space sampling steps may have varying flip angles. Varying the flip angles offers advantages in improving the SNR.

According to a further important advantage of the invention, collecting the time-dependent image sequence can be utilized for providing a three-dimensional (3D) reconstruction of the object. The steps of k-space sampling in the two segments, i.e. the pairwise segment sampling is conducted with a changing direction of the phase blips relative to an axis deviating from the axis of phase encoding. Thus, the 3D reconstruction of the object is obtained with a cylindrical 3D sampling geometry. The phase blips are rotated by a predetermined rotation angle ($\varphi$), preferably about the readout direction, for each of the two segments of k-space sampling steps. Typically, the phase blips can be gradually rotated by the rotation angle for each of the sampling steps. Alternatively, the rotation angle ($\varphi$) of the direction of the phase blips can be selected with a randomized or pseudo-randomized acquisition scheme.

According to a particularly preferred embodiment of the invention, a preparation step is provided before the k-space sampling. Advantageously, the preparation step creates a magnetic preconditioning of the object for facilitating a predetermined magnetic spin concentration contrast to be imaged. A general advantage of including the preparation step to the DEPICTING method is the achievement of a minimal echo time, which maximizes the SNR, reduces unwanted influences from $T_2^*$ relaxation on the image contrast, and minimizes the time for evolution of phase errors due to magnetic field inhomogeneities.

The preparation step includes subjecting the object to at least one RF preparation pulse. Subsequently, the inventive k-space sampling is conducted. The at least one RF preparation pulse can be created before each pair of two excitations pulses with subsequent encoding sequences. Alternatively, the at least one RF preparation pulse can once be created for all subsequent encoding sequences. The k-space sampling is conducted after a predetermined magnetization recovery delay time ($T_{delay}$) relative to the end of the at least one preparation pulse. The recovery delay time is selected in dependence on the type of preparation and the contrast to be enhanced by the preparation. During the magnetization recovery delay time, the object can be subjected to spoiling gradients, again selected in dependence on the type of preparation and the contrast to be enhanced.

The at least one RF preparation pulse may comprise a single 180° inversion pulse, a composite inversion pulse, an adiabatic inversion pulse, a sequence of RF inversion pulses designed to achieve inversion of the magnetization, or a sequence of RF pulses designed to achieve rotating the magnetization by 90° and to achieve saturation.

If the object is subjected to a driven-equilibrium pulse sequence before each or all of the excitation and encoding sequences of magnetic field gradients, image contrast can be generated which depends upon the transverse relaxation time, $T_2$. The traditional driven-equilibrium pulse sequence of the preparation step may also be modified to produce a stimulated echo instead of a primary spin echo. According to a further variant of the driven-equilibrium pulse sequence, a pair of identical diffusion-weighting gradient lobes can be added on either side of the refocusing pulse or sequence of refocusing pulses of the driven-equilibrium pulse sequence. Thus, a diffusion-weighted DEPICTING pulse sequence can be obtained.

The preparation step can be utilized for spectroscopic DEPICTING imaging. To this end, the object is subjected to a combination of two 90° pulses or another sequence of RF pulses designed to achieve rotating the magnetization by 90° followed by a variable evolution period $t_1$ for encoding of the resonance frequency and rotating the magnetization back to the longitudinal axis. Subsequently, the object is subjected to spoiling gradients following the rotating RF pulses.

If according to a further variant, the object is subjected to the at least one rotating preparation pulse in the presence of a magnetic field gradient along the direction of an arterial blood flow upstream of the imaging region, a partial or total inversion of the magnetization of arterial blood can be achieved. Thus advantages for imaging local blood flow can be obtained.

BRIEF DESCRIPTION OF THE DRAWINGS

Further details and advantages of the invention are described in the following with reference to the attached drawings, which show in.

PREFERRED EMBODIMENTS OF THE INVENTION

Preferred embodiments of the invention are described in the following with particular reference to the construction of the excitation and encoding sequences. Timing sequences are graphically represented as introduced in prior publications, see e.g. publications [5] and [20]. Details of creating the RF pulses and gradients of these sequences, collecting the MR signals and controlling an MR scanner as well as details of the construction of an MR scanner are not described as far as they are known from conventional MR imaging techniques. Furthermore, after reconstructing the at least one image of the object, the image can be subjected to a further image processing or image recording, displaying, storing, or printing as it is known in prior art.

DEPICTING Method

Figure 1:
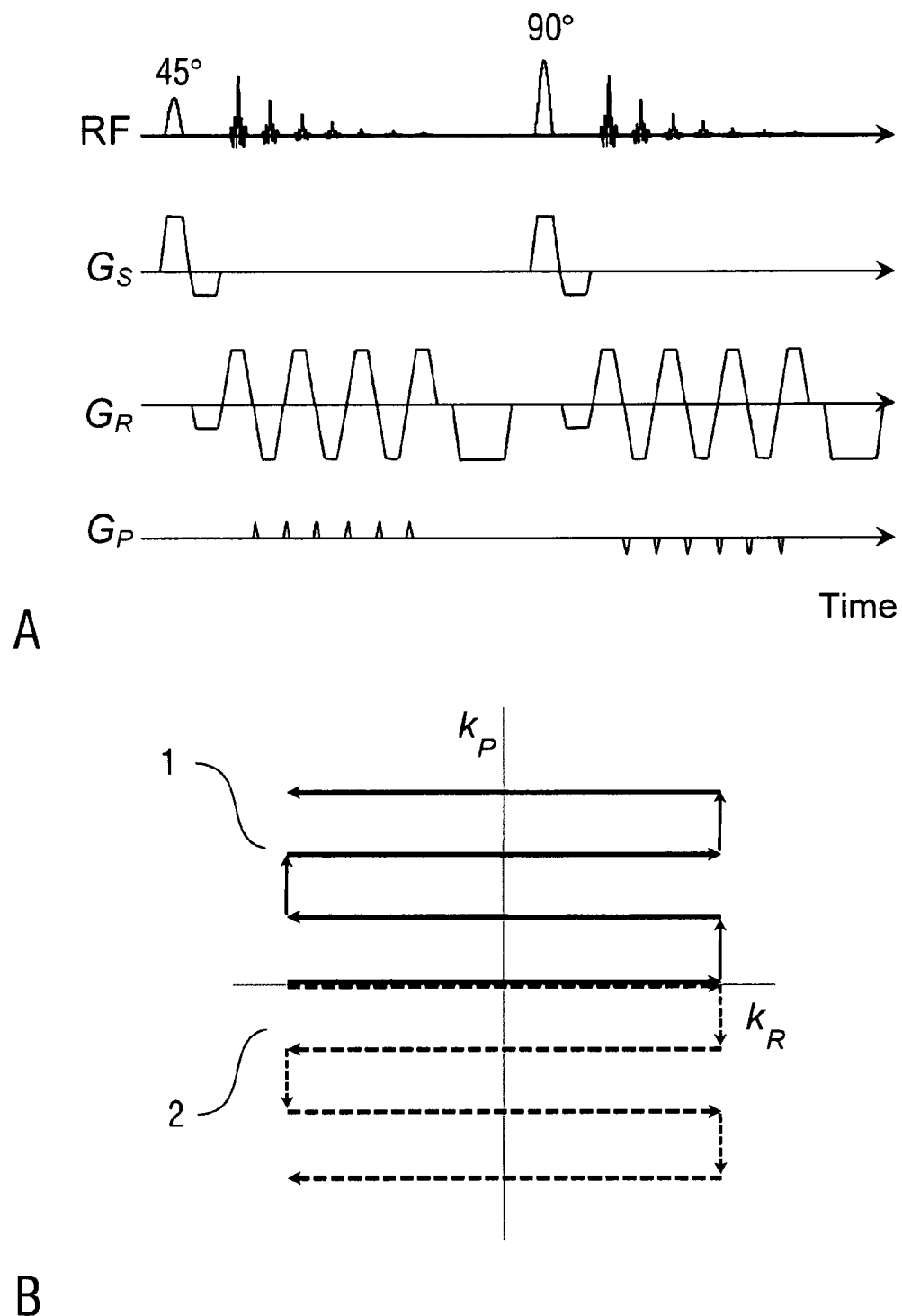
FIG. 1: (A) a first embodiment of an inventive DEPICTING imaging pulse sequence and (B) corresponding k-space trajectories.

FIG. 1 shows the basic RF pulse and gradient sequence for the inventive DEPICTING method and the corresponding k-space trajectories. The first tile 1 of k-space data is sampled with a given polarity of the phase blips (e.g., positive) following a first excitation pulse (45° pulse). After appropriate spoiling gradients and a second excitation pulse (90° pulse), phase blips of the opposite polarity (e.g., negative) are used to sample the data of the second tile 2 of k-space (see e.g. publications [5] and [20]). Note that the gradient lobes can appear on any arbitrary direction. It is also possible to use another combination of pulse flip angles, which may be advantageous in specific applications (e.g., if a short repetition time is employed, it may be preferable to replace the 90° pulse by an Ernst-angle pulse and to reduce the flip angle of the 45° pulse accordingly to obtain the same signal amplitude). Both excitations produce equal quantities of transverse magnetization as long as longitudinal relaxation during the acquisition window is negligible, which is commonly fulfilled. A technique for reducing Nyquist ghosting artifacts may be based, for example, on a separate reference scan without phase blips and pair-by-pair correction of phase differences between odd and even echoes in each tile [21].

At ultra-short echo times, eddy currents induced by the sliceselection gradient might trigger echo shifts within the first k-space lines. This effect is easily corrected by a line-byline phase correction for the first few effected echoes. For the majority of the remaining echoes recorded when the gradient system has approached a steady state, even echoes are manipulated only. Strategies proposed in the past for multi-shot EPI with center-out trajectories (see e.g. [14]) rely on the acquisition of a navigator echo at the beginning of each segment before subsequently collecting the k-space lines.

In the inventive DEPICTING method, the data of the central k-space line $L_{centr}$ acquired for each tile 1, 2 are used as intrinsic navigators (reference data) for phase and intensity correction. The two corrected lines are then averaged for SNR improvement to generate a new central line for the final full k-space data. Hence, information about inter-segment corrections is recorded simultaneously with information about the spin-density distribution for image reconstruction without a need for acquiring extra navigator echoes. Moreover, intrinsic navigators are exploited for the correction of a global drift of the main magnetic field, $B_0$, during the acquisition of long time series, thus improving the time-course stability and point-spread function [22].

Because both tiles 1, 2 are acquired with opposite polarities of the phase blips, $B_0$ inhomogeneities induced by magnetic susceptibility variations produce simultaneous shifts in opposite directions along the phase-encoding direction. Correction of this artifact can be performed, for example, by removing off-resonance frequencies in k-space if the distribution of the magnetic field is precisely known across the object [23, 24]. For this purpose, a separate acquisition of a multi-echo field-map scan is performed. This can be done, for example, with a standard EPI sequence using similar gradient settings as for DEPICTING but omitting the phase blips and adding a phase-encoding scheme to permit multi-echo spatial encoding [25, 26].

Two examples for the application of the inventive DEPICTING method are subsequently described. In the first example, suppression of the BOLD contrast in a series of images recorded during visual stimulation is demonstrated. The DEPICTING sequence with center-out acquisition of two tiles with a delay of approximately 3 ms permits functional brain mapping with the same temporal efficiency as conventional single-shot EPI, which was here acquired separately for comparison. At $TE_{eff}=25$ ms, DEPICTING yields similar sensitivity, stability, and localization of activation as conventional single-shot EPI.

Figure 2:
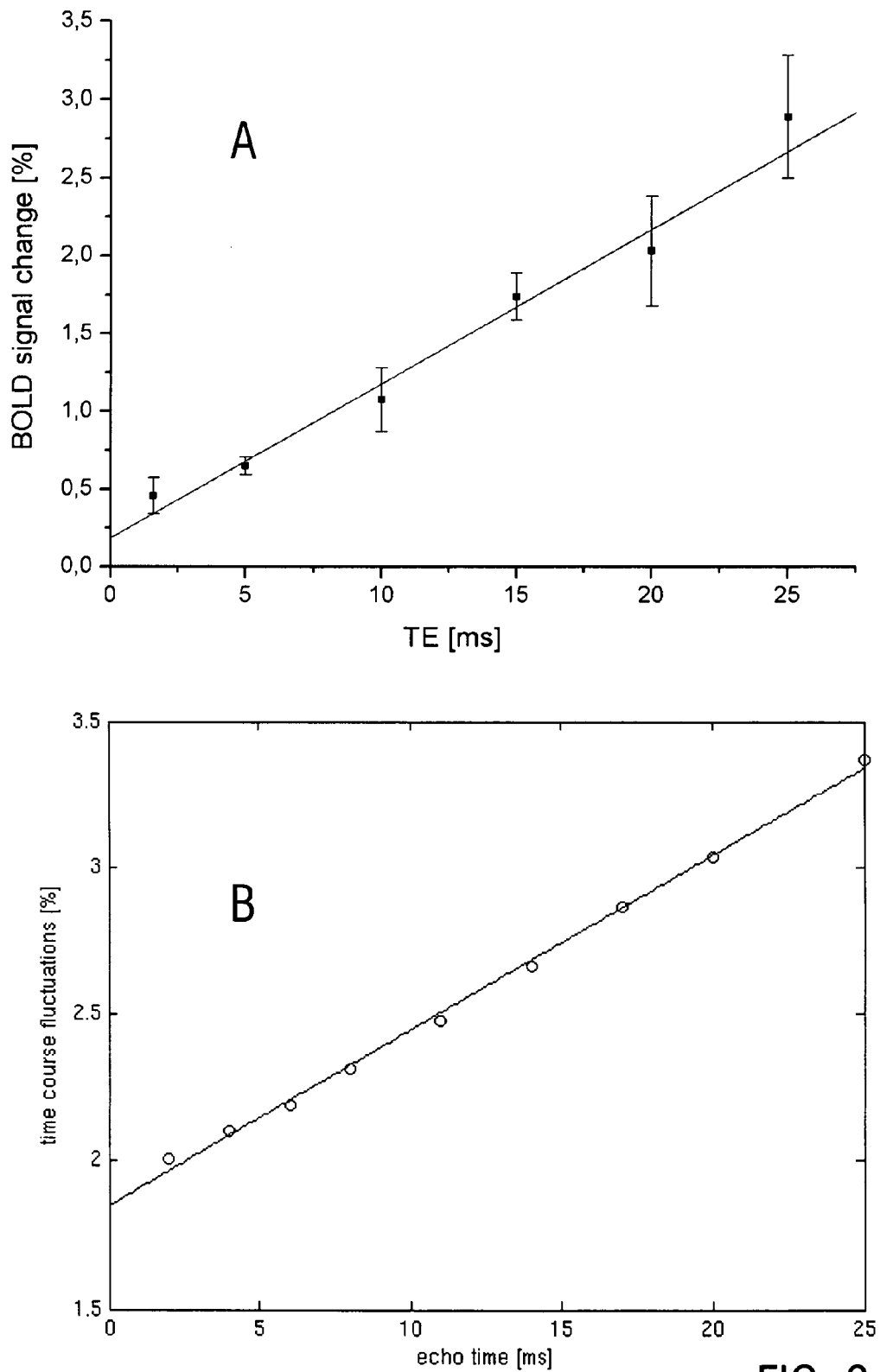
FIG. 2: graphical representations of experimental results obtained with the inventive DEPICTING imaging pulse sequence.

FIG. 2A demonstrates the echo-time dependence of the observed BOLD signal change in the human primary visual cortex (average over four healthy human subjects). The BOLD signal drops from approximately 3% at $TE_{eff}=25$ ms to less than 0.5% at 1.5 ms. The remaining BOLD signal is probably caused by intravascular contributions, which are observable because of the very low flow-weighting of the DEPICTING sequence [15, 16]. Decreasing $TE_{eff}$ from 25 to 1.5 ms results in a 40% improvement (FIG. 2B) of the temporal signal stability (measured in a white-matter region) due to the suppression of physiological noise [27].

Use of an ultra-short $TE_{eff}$ reduces signal dropouts in regions that are prone to artifacts due to variations in the magnetic susceptibility. Non-BOLD imaging applications, such as perfusion or diffusion MRI, would benefit by the associated superior signal stability and BOLD suppression capability of the sequence.

Figure 3:
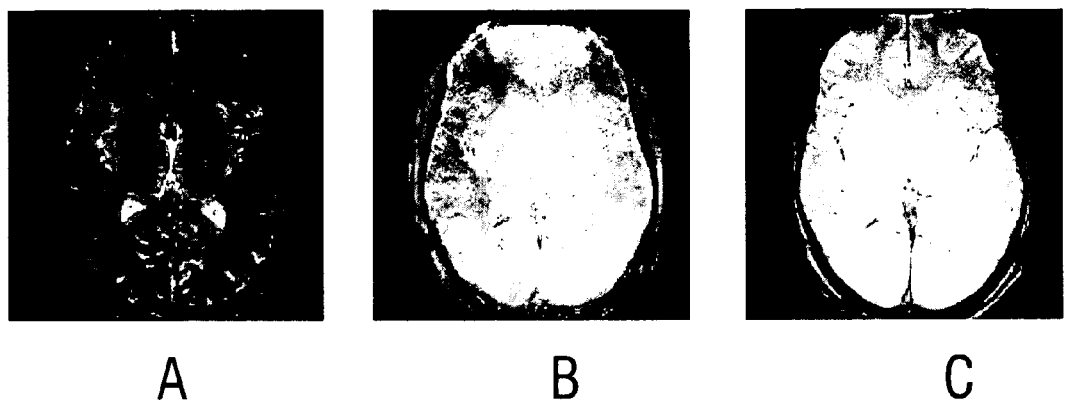
FIG. 3: photographical representations of experimental results obtained with conventional single-shot EPI (A), conventional FLASH (C), and the inventive DEPICTING imaging pulse sequence (B)

The second example shows a high-resolution image acquired with the DEPICTING sequence (FIG. 3B) in comparison to a conventional single-shot EPI scan (FIG. 3A), and a standard gradient-echo image acquired with a fast low-angle shot (FLASH) sequence (FIG. 3C). The high-resolution conventional single-shot EPI image of FIG. 3A was recorded at the minimal effective echo time ($TE_{eff}=96$ ms, in-plane voxel size $1\times1$ mm$^2$), while FIG. 3B shows the corresponding high-resolution DEPICTING image with $TE_{eff}=1.6$ ms and in-plane voxel size $1\times1$ mm$^2$). The conventional FLASH image of FIG. 3C was recorded with TE=6 ms and in-plane voxel size $0.75\times0.75$ mm$^2$.

Figure 4:
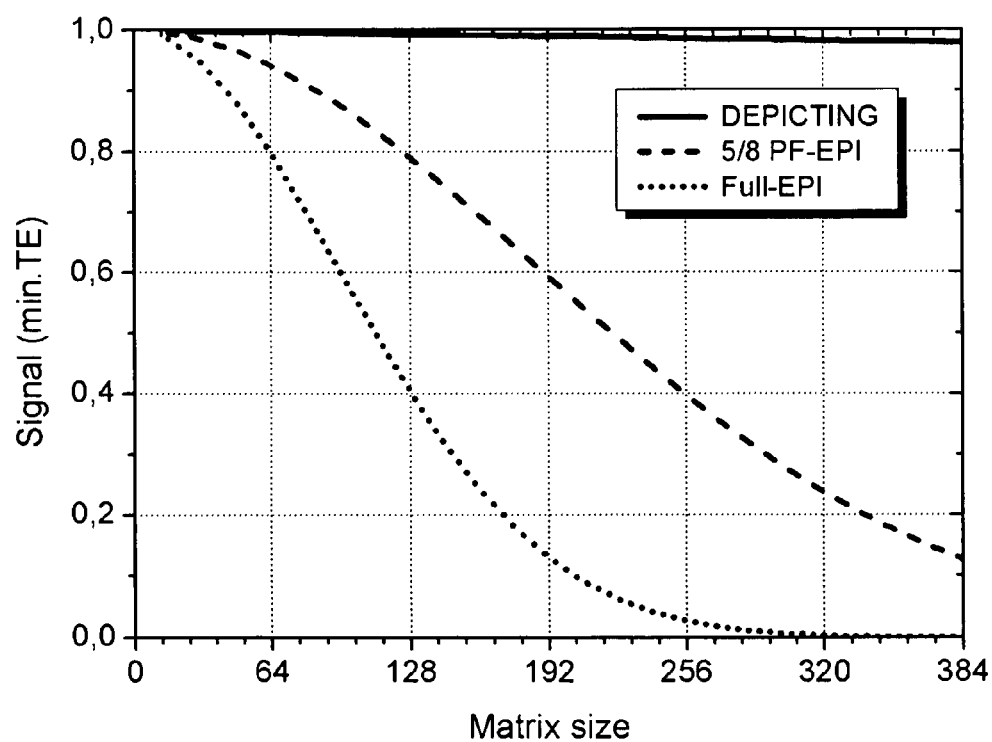
FIG. 4: results of theoretical simulation of the resonance signals with varying acquisition-matrix sizes.

Comparison of FIGS. 3A and 3B demonstrates the excellent SNR achieved with the DEPICTING sequence as compared with conventional EPI. The observed signal gain of approximately a factor of eight is consistent with results from simulations of the signal intensity at the minimum $TE_{eff}$ and a matrix size of 192×192 (FIG. 4). An excellent correspondence even for small anatomical structures is obtained for the DEPICTING and the FLASH images, which indicates that the improved point-spread function supports high-resolution imaging experiments [9].

FIG. 4 demonstrates theoretical simulations of the signal level (signal at minimum $TE_{eff}$ as a function of the acquisition-matrix size) obtained with the inventive DEPICTING method (solid line) in comparison with conventional single-shot EPI with partial k-space acquisition of ⅝ of the full k-space data (broken line), and with conventional single-shot EPI with acquisition of the full k-space matrix (dotted line).

Figure 5:
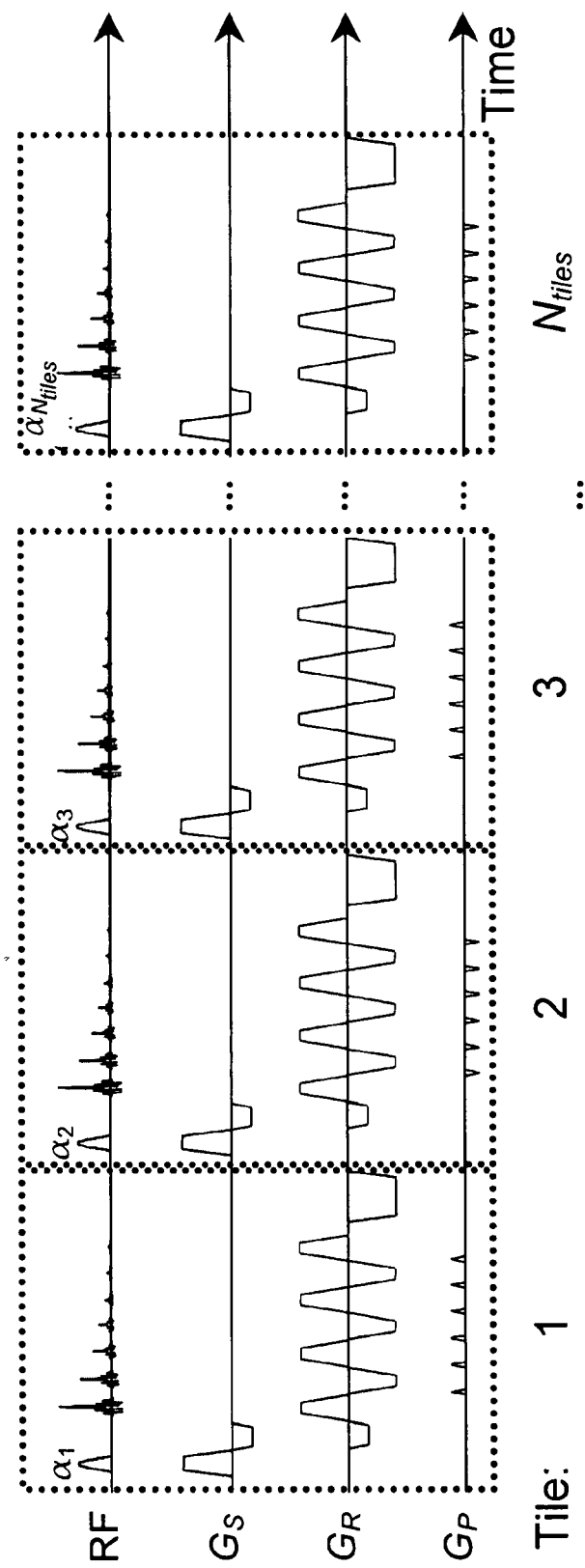
FIG. 5: a further embodiment of an inventive DEPICTING imaging pulse sequence utilized for serial imaging.

A strategy to collect a time series of images is shown in FIG. 5. Here, $N_{tiles}$ tiles with alternating polarity of the phase blips are acquired in a way that each tile covers one half of k-space, and odd and even tiles are sampled with opposite polarity of the phase blips. Preferably, MR signals collected in immediately adjacent k-space segments are combined pairwise. Thus the best temporal resolution is obtained by reconstructing a total of $N_{tiles}-1$ DEPICTING images from the combined full k-space data of tiles 1 and 2, tiles 2 and 3, tiles 3 and 4, etc. up to tiles $N_{tiles}-1$ and $N_{tiles}$.

To generate a similar signal intensity for each acquisition, relatively small flip angles, e.g. α<20°, should be used. This flip angle may be identical for all tiles in the most simple case (e.g., the Ernst angle). Alternatively, the SNR can be improved by using variable flip angles. In particular, if the time $TR_t$ required to acquire a single tile is sufficiently short compared with the longitudinal relaxation time, $T_1$, relaxation effects may be ignored, and the flip angle for the nth excitation ($1 \leq n \leq N_{tiles}$) is preferably selected according to [20, 28]:

$$\sin\alpha_n = \tan\alpha_{n-1} \Rightarrow \alpha_n \quad (4)$$
$$= \arctan\frac{1}{\sqrt{N_{tiles} - n}} \text{ if } n < N_{tiles} \wedge \alpha_{N_{tiles}}$$
$$= 90°$$

A more accurate calculation that takes $T_1$ relaxation into account has also been published [28].

Figure 6:
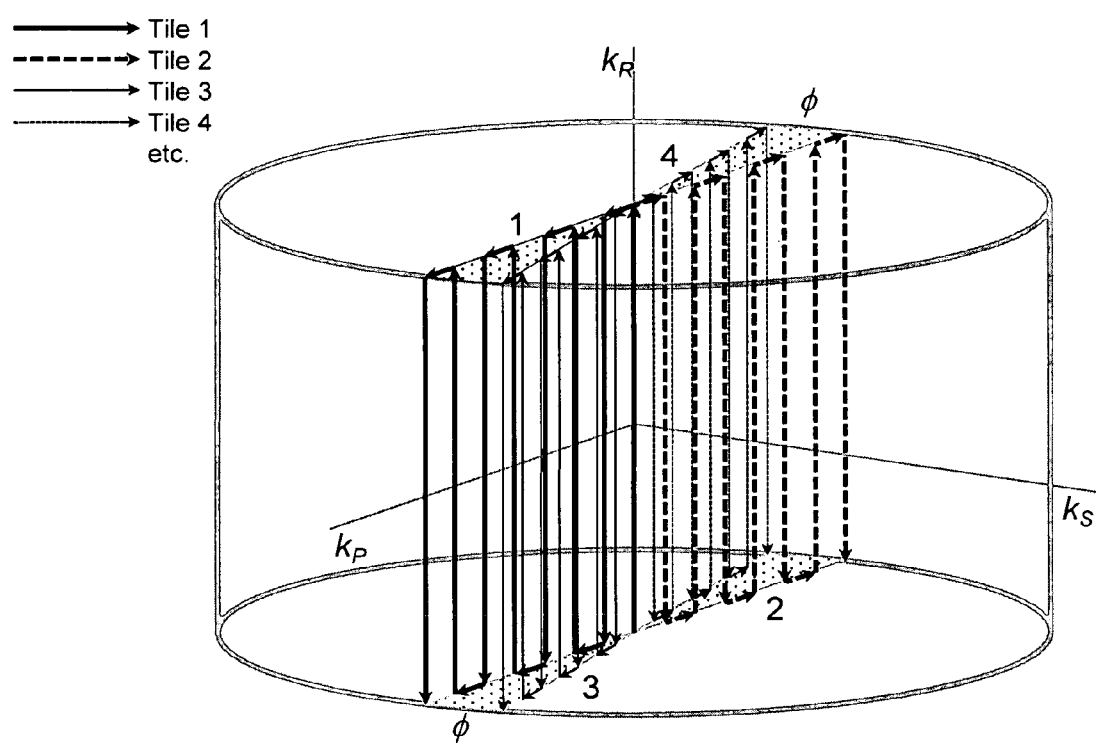
FIG. 6: a further embodiment of an inventive DEPICTING imaging pulse sequence utilized for 3D imaging.

Collecting a time series of images can be utilized for 3D imaging as schematically shown in FIG. 6. 3D volume acquisition maintaining all advantages of the 2D DEPICTING method is possible, e.g. by using a cylindrical 3D sampling strategy. In the specific example of FIG. 6, two tiles in the $k_R k_P$-plane are sampled in an identical fashion as with the 2D DEPICTING sequence shown in FIG. 1. Subsequently, the direction of the phase blips is rotated about the readout direction by an angle ϕ, and another pair of tiles is acquired. This procedure is repeated with increasing rotation angle to obtain an even distribution of radially arranged tiles, that is, a cylinder of k-space oriented along the $k_R$-axis is sampled. The radial sampling intervals between tiles will match the Cartesian sampling grid of each tile if $N_{tiles} = \pi \times N_{etl}$ [29].

Considering sequence parameters as assumed above (i.e., gradient amplitude 45 mT/m, gradient slew rate 150 T/m/s, receiver bandwidth ±75 kHz, field of view 20 cm, acquisition matrix 128×128, echo spacing 1.088 ms), the echo-train length for each tile is $N_{etl}=64$, which can be sampled in approximately 72 ms. Acquisition of a full 3D data set with isotropic voxel dimensions of 1.5 mm requires 200 tiles and is possible within 14.4 sec.

For the excitation pulses, a constant small flip angle or a variable flip-angle scheme according to Eq. (4) may be used. It may also be preferable to replace the sequential acquisition of tiles by a randomized or pseudo-randomized acquisition. It is finally not necessary to acquire tiles of k-space in a pairwise fashion with exactly opposite directions of the phase blips as shown in FIG. 6, but the rotation angle ϕ of the direction of the phase blips may be changed in a randomized fashion for every tile. As the DEPICTING method is compatible with parallel-imaging approaches, the total acquisition time may even be reduced to less than 5 sec.

DEPICTING Method Including the Preparation Step

According to the invention, a preparation step can be provided immediately before the k-space sampling of the DEPICTING method. Besides proton-density imaged without a preparation, other contrasts are obtainable by combining the suitable preparation with the DEPICTING method. Such preparation steps are known as such for other fast imaging methods, such as conventional EPI [30] or snapshot FLASH [31].

Figure 7A:
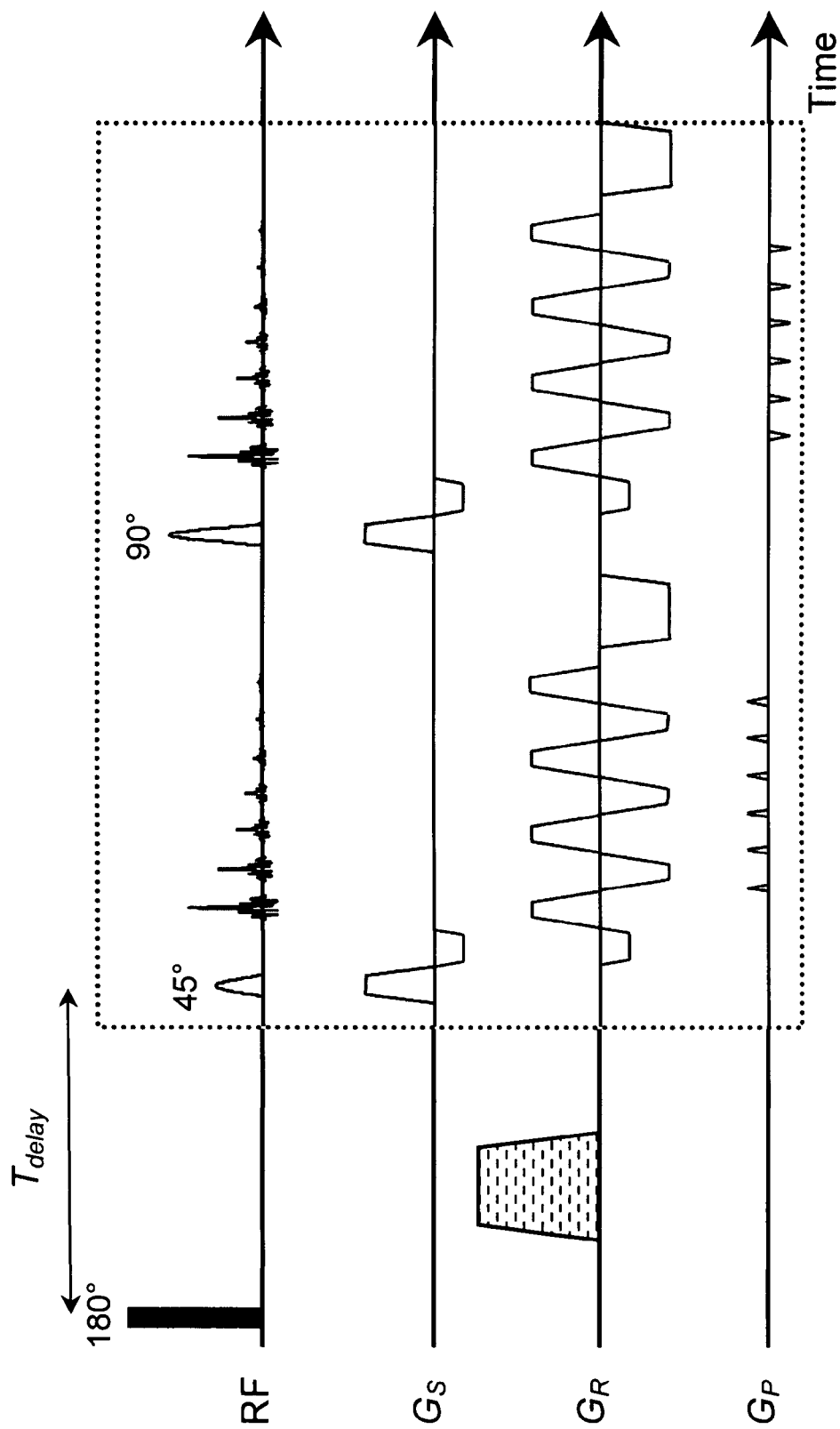
FIG. 7: a further embodiment of an inventive DEPICTING imaging pulse sequence including an inversion-recovery preparation step yielding (A) a single image and (B) a series of images.
Figure 7B:
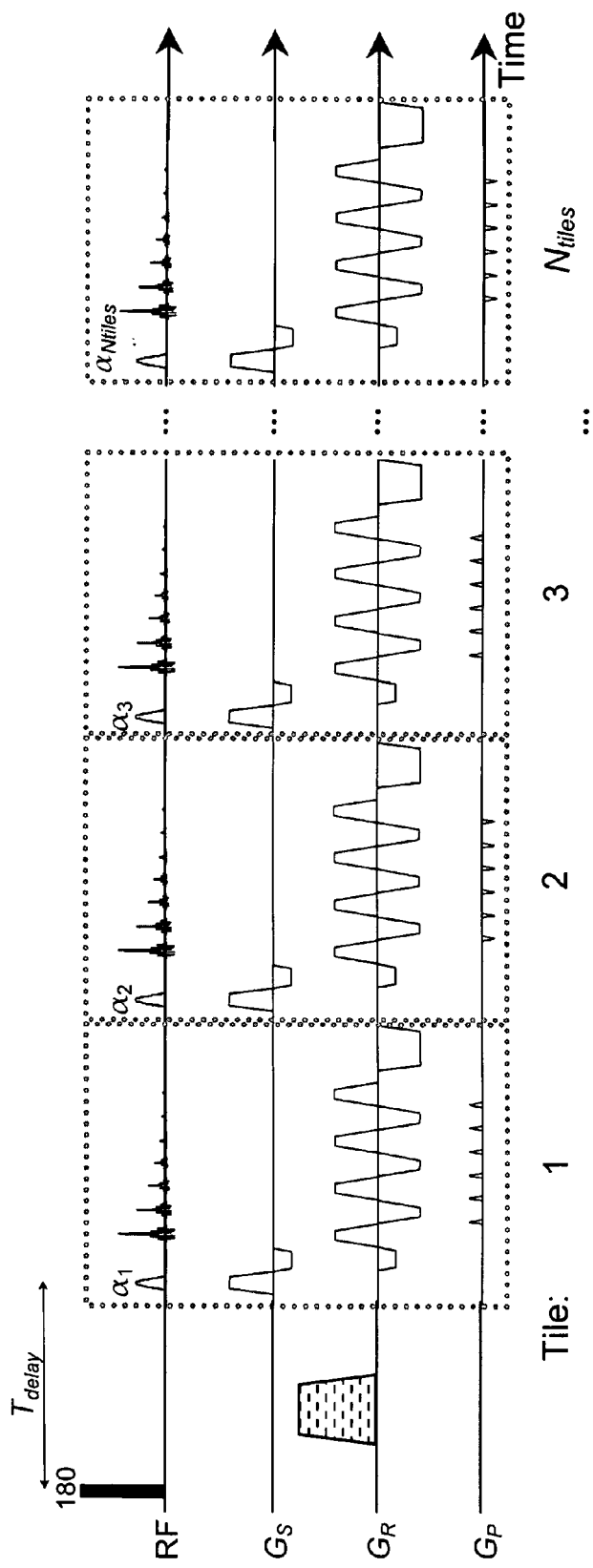

With a first variant of the preparation step, a 180° RF pulse inverts the magnetization, and the DEPICTING scheme is executed after an inversion-recovery delay $T_{delay}$. FIG. 7 illustrates timing diagrams of two pulse programs for inversion-recovery DEPICTING imaging yielding a single image (FIG. 7A) or a series of $N_{tiles}-1$ images (FIG. 7B) for the measurement of the inversion-recovery curve in a single experiment. An optional spoiler gradient following the 180° inversion pulse is dashed. The gradient lobes can appear on any arbitrary direction.

It is to be noted here that the simple rectangular 180° RF pulse as shown in FIG. 7A may also be replaced by a composite pulse, an adiabatic pulse, or another sequence of RF pulses designed to achieve inversion of the magnetization. Instead of inverting the whole magnetization of the object, it may also be useful to invert the magnetization in only a well-described region, such as a slice of specific orientation and thickness by using a slice-selective pulse or even in an arbitrarily shaped region by using another suitable type of spatially selective excitation. As yet another alternative, the inversion pulse may also be replaced by an RF pulse scheme rotating the magnetization by only 90° to achieve saturation. During $T_{delay}$, which may range from 10 ms to 10 sec, in particular depending on the longitudinal relaxation time, so-called spoiling gradients may be applied to destroy any residual transverse magnetization resulting from imperfections in the RF pulse.

The magnetization detected by the DEPICTING sequence after this preparation will depend upon longitudinal relaxation as specified by the relaxation time $T_1$. Any desired contrast contribution from longitudinal relaxation may be selected by proper adjustment of $T_{delay}$. As an example, this type of preparation can be used to attenuate specific signal contributions, for example from cerebrospinal fluid or from lipids. The preparation may further be used to measure the spatial distribution of $T_1$ by performing a series of experiments with variation of $T_{delay}$ and fitting the obtained recovery curve to a model function.

In a further modification shown in FIG. 7B, a complete series of DEPICTING images is acquired during the recovery period following a single preparation of the magnetization by inversion or saturation; that is, with the minimal possible acquisition time. In this case, the highest sampling rate of the recovery curve is achieved with the technique outlined above for serial acquisitions.

With a further variant of the preparation step (FIG. 8), a preparation module prior to the DEPICTING sequence consists of a so-called driven-equilibrium (also known as driven-equilibrium Fourier transform, DEFT) pulse sequence to generate contrast depending upon the transverse relaxation time, $T_2$. Typically, it consists of an initial $90°_x$ pulse to generate transverse magnetization, followed by a $180°_y$ refocusing pulse after an evolution delay τ to produce a spin echo at time 2τ. An another $90°_{-x}$ pulse at the refocusing point of the echo is then used to flip the magnetization back to the longitudinal axis. The evolution delay may range from 1 ms to 1 sec in particular depending on the transverse relaxation time. The gradient lobes can appear on any arbitrary direction.

Figure 8:
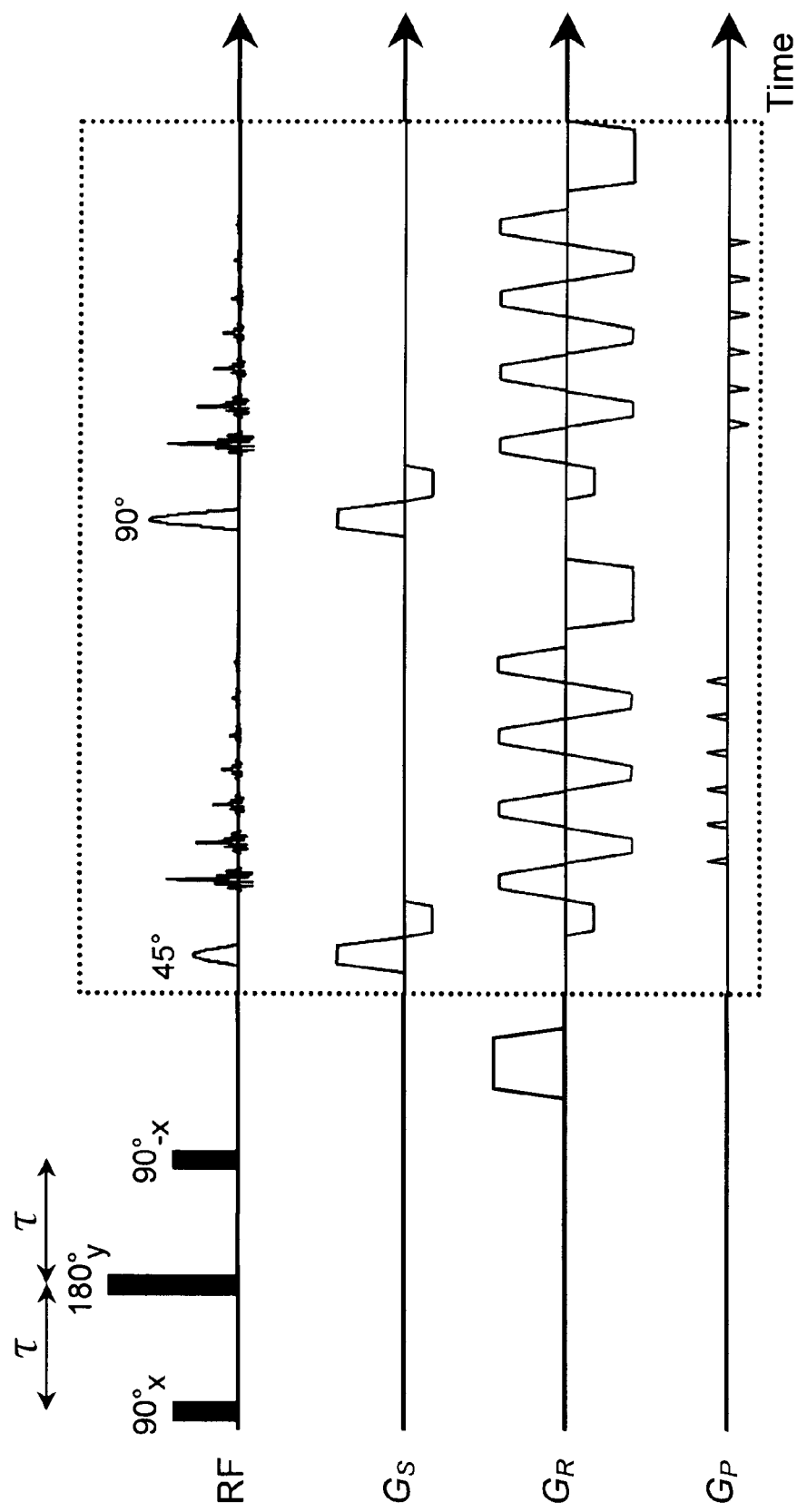
FIG. 8: a further embodiment of an inventive DEPICTING imaging pulse sequence including a driven equilibrium Fourier transform (DEFT) preparation step.

Different settings for the pulse phases and/or amplitudes or application of multiple refocusing pulses are also possible. It is to be noted that the rectangular RF pulses as shown in FIG. 8 may be replaced by composite pulses, adiabatic pulses, or other sequences of RF pulses designed to achieve refocusing of the magnetization. In particular, instead of a spin echo, generation of a stimulated echo (e.g., by application of three 90° RF pulses), which is flipped back to the longitudinal axis by application of a 90° RF pulse at the refocusing point is also possible. It may also be useful to apply the preparation scheme in only a well-described region, such as a slice of specific orientation and thickness by using slice-selective pulses, or even in an arbitrarily shaped region by using another suitable type of spatially selective excitation. Immediately after the preparation scheme, two tiles of k-space are sampled with the DEPICTING sequence.

Figure 9A:
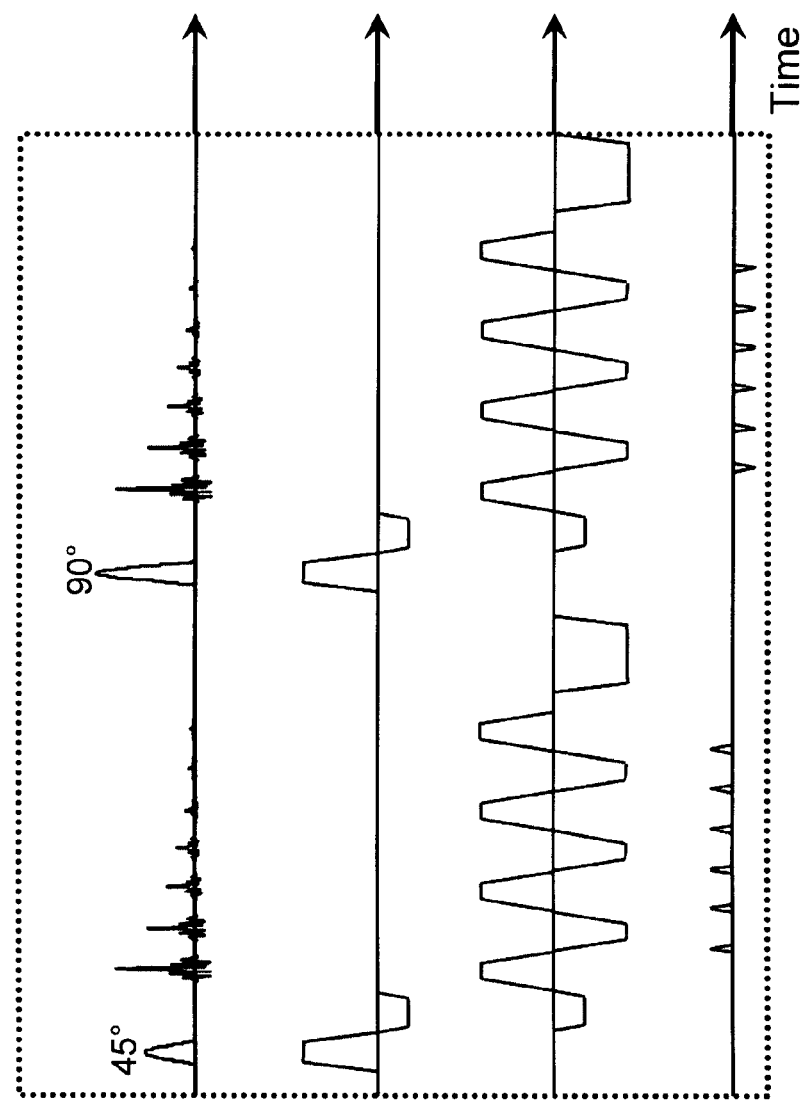
FIG. 9: a further embodiment of an inventive DEPICTING imaging pulse sequence including DEFT (A) and twice-refocused spin-echo (B) preparation steps with diffusion encoding.
Figure 9A:
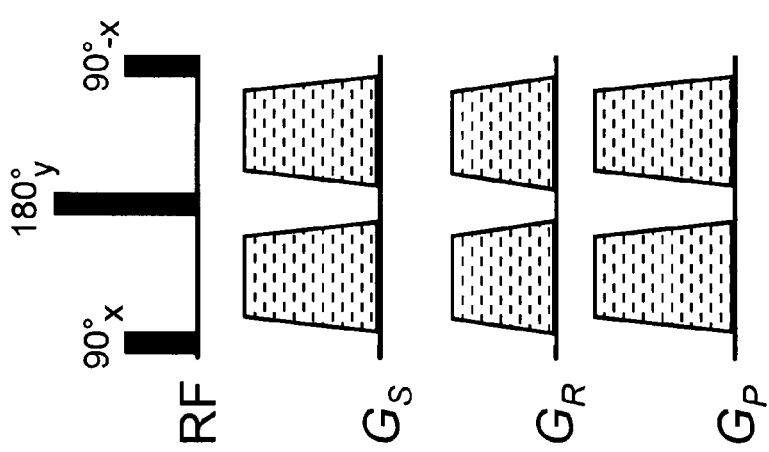
Figure 9B:
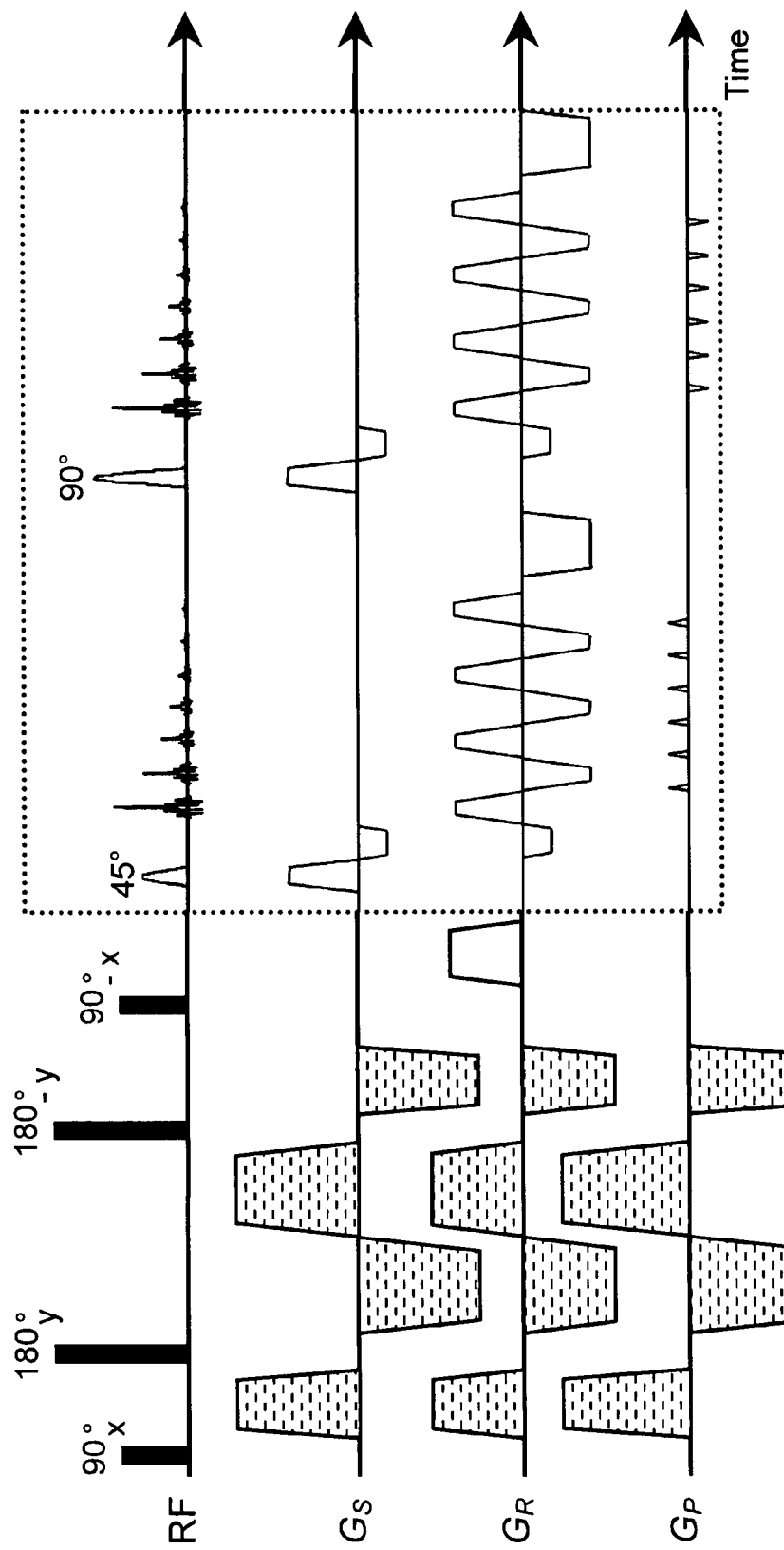

By adding the pair of identical diffusion-weighting gradient lobes on either side of the 180° pulse of the DEFT preparation module, a diffusion-weighted DEPICTING pulse sequence is obtained. FIG. 9 illustrates examples of such pulse sequences for diffusion-weighted DEPICTING imaging by using the DEFT preparation with diffusion-encoding gradients indicated in FIG. 9A or a twice-refocused spin-echo preparation with diffusion-encoding gradients indicated in FIG. 9B (dashed).

The additional diffusion-weighting gradient lobes can be applied in any arbitrary direction. Replacing the 180° refocusing pulse by two 90° pulses to generate a stimulated echo is also possible and may be of advantage if diffusion is to be investigated as a function of the diffusion time or if $T_2$ is relatively short. A well-known problem associated with the diffusion preparation by a DEFT module is that eddy currents created by the diffusion-weighting gradient lobes prevent complete refocusing of the transverse magnetization. Consequently, the magnetization returned to the longitudinal axis at the end of the preparation does not exclusively reflect diffusion attenuation but also the spatially dependent eddy-current field leading to systematic overestimations of the diffusion coefficient. This error will differ for different directions, which impairs diffusion-tensor imaging or related experiments. It is thus preferred to use diffusion-preparation schemes with full compensation of eddy currents. Examples are the twice refocused preparation scheme [32] shown in FIG. 9b or an alternative scheme proposed by Finsterbusch [33]. Again, the rectangular RF pulses as shown in FIG. 9 may also be replaced by composite pulses, adiabatic pulses, or other sequences of RF pulses designed to achieve refocusing of the magnetization. It may also be useful to apply the preparation scheme in only a well-described region, such as a slice of specific orientation and thickness by using slice-selective pulses, or even in an arbitrarily shaped region by using another suitable type of spatially selective excitation. Compared with conventional EPI as the most prevalent sequence for diffusion imaging, the use of DEPICTING with diffusion preparation achieves a significant reduction of the effective echo time and thus reduced signal loss due to transverse relaxation with a concomitant gain in SNR. For example, if a full matrix of 128×128 is acquired for diffusion imaging with an echo spacing of 1.088 ms, the effective echo time is reduced by $t_{es} \times (N_{efl}-1) \approx 138$ ms when using DEPICTING instead of conventional EPI. Assuming $T_2=80$ ms [7], this corresponds to an SNR gain by 460%. In comparison to EPI with partial k-space acquisition and 12.5% overscan lines, $TE_{eff}$ is reduced by $2 \times t_{es} \times N_{of} \approx 35$ ms when using DEPICTING, which corresponds to an SNR gain by 95%. Besides the SNR gain, the reduction of the effective echo time concomitantly reduces the acquisition time per image and, hence, improves the overall temporal efficiency of the sequence.

Figure 10:
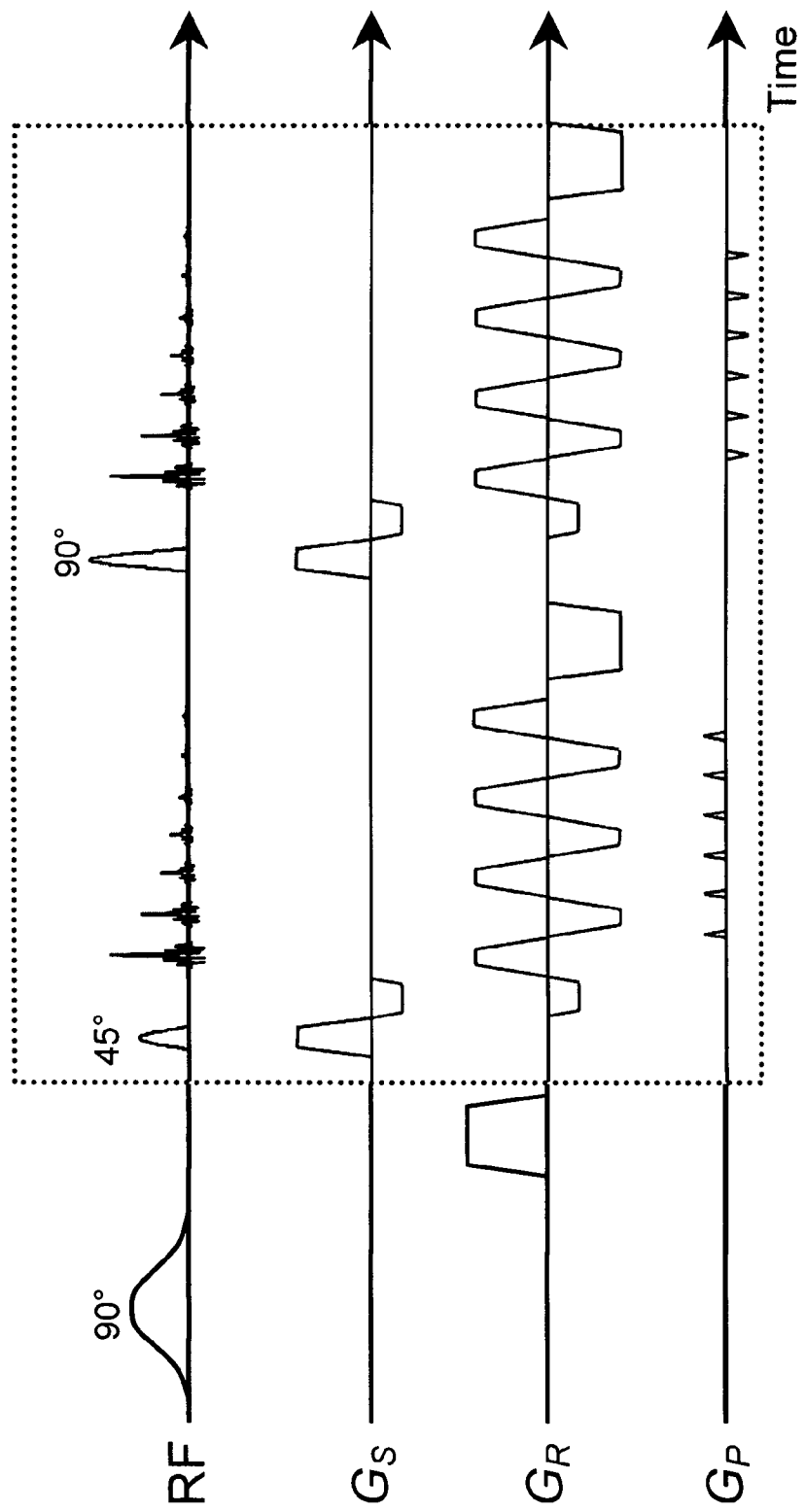
FIG. 10: an example of a pulse sequence for chemical-shift selective DEPICTING imaging using a frequency-selective saturation pulse.

With yet a further variant of the preparation step (FIG. 10), a preparation module consists of a frequency-selective 90° pulse or another type of frequency-selective saturation scheme. The DEPICTING sequence executed after an additional spoiler gradient will detect only magnetization that was unaffected by the preparation. Thus chemical-shift selective DEPICTING imaging can be obtained as shown in FIG. 10 with an example of a pulse sequence using a frequency-selective saturation pulse. The gradient lobes can appear on any arbitrary direction.

Figure 11:
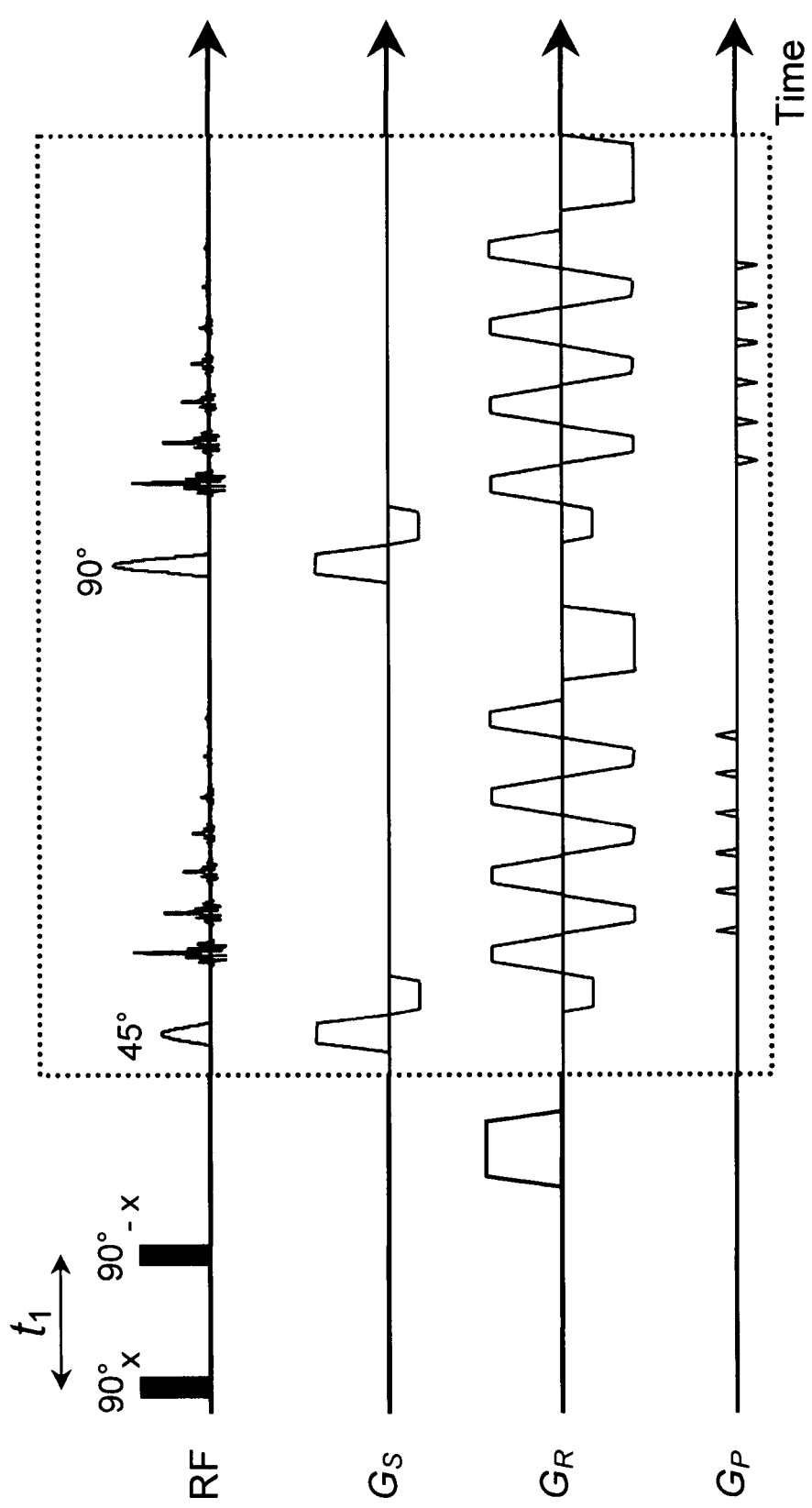
FIG. 11: an example of a pulse sequence for spectroscopic DEPICTING imaging.

With yet a further variant of the preparation step (FIG. 11), a pair of two phase-shifted 90° pulses is applied and followed by a spoiler gradient and the DEPICTING sequence. This whole experiment is repeated N times (typically between 8 and 1024) with different evolution times $t_1$. The time interval $t_1$ between the two 90° preparation pulses is increased in a linear fashion with typical increments (defining a dwell time) between 1 ms and 10 ms. Subsequent Fourier transformation of the resulting series of DEPICTING images with respect to $t_1$ yields a magnetic resonance spectrum for each image voxel. Thus, spectroscopic DEPICTING imaging can be obtained in which chemical-shift information is provided. Alternatively, other techniques to encode chemical-shift information may replace the pair of 90° pulses. The gradient lobes can appear on any arbitrary direction.

Figure 12A:
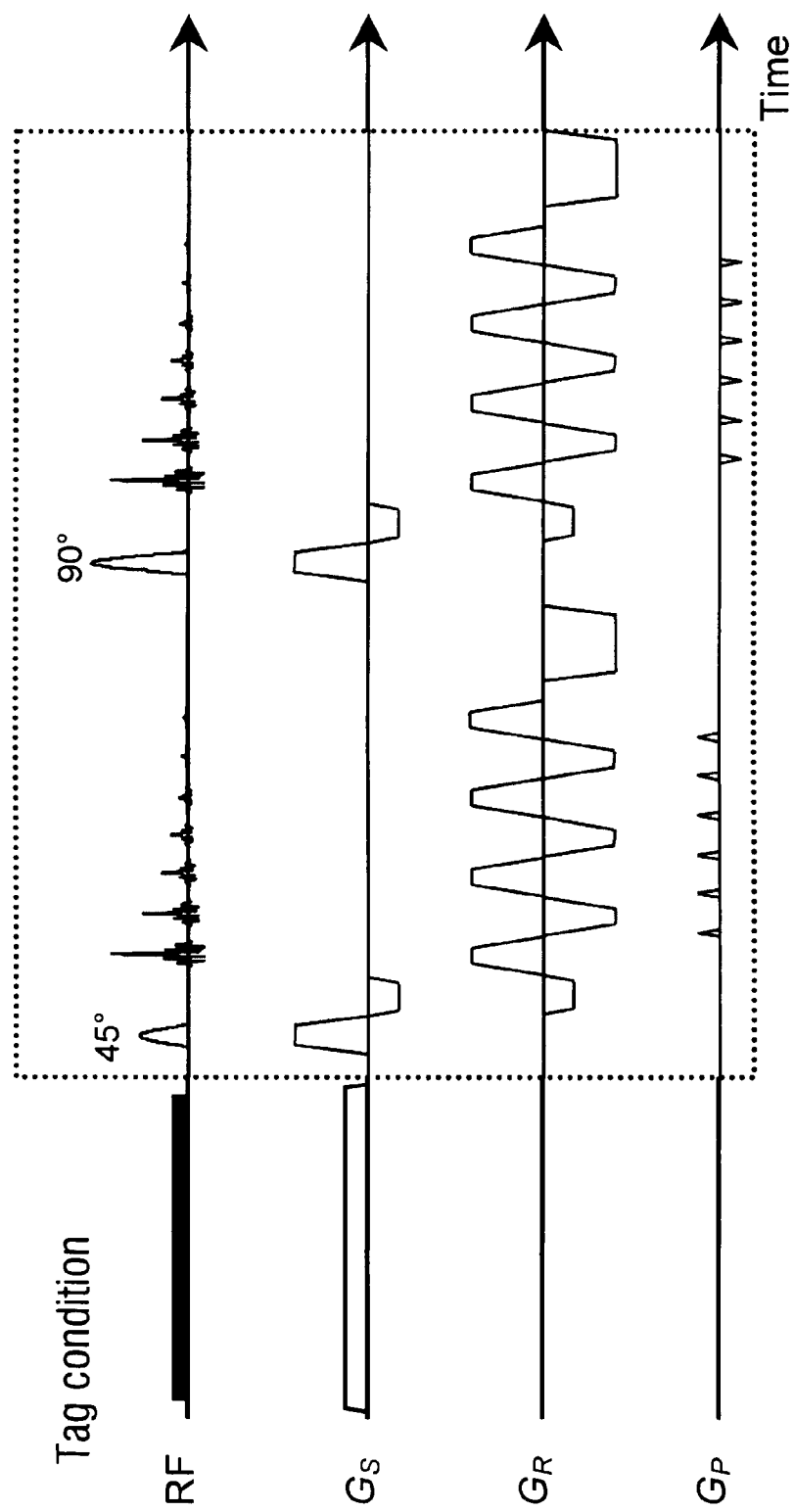
FIG. 12: (A, B) an example of a pulse sequence for perfusion imaging, and (C) photographical images of regional cerebral blood flow.
Figure 12B:
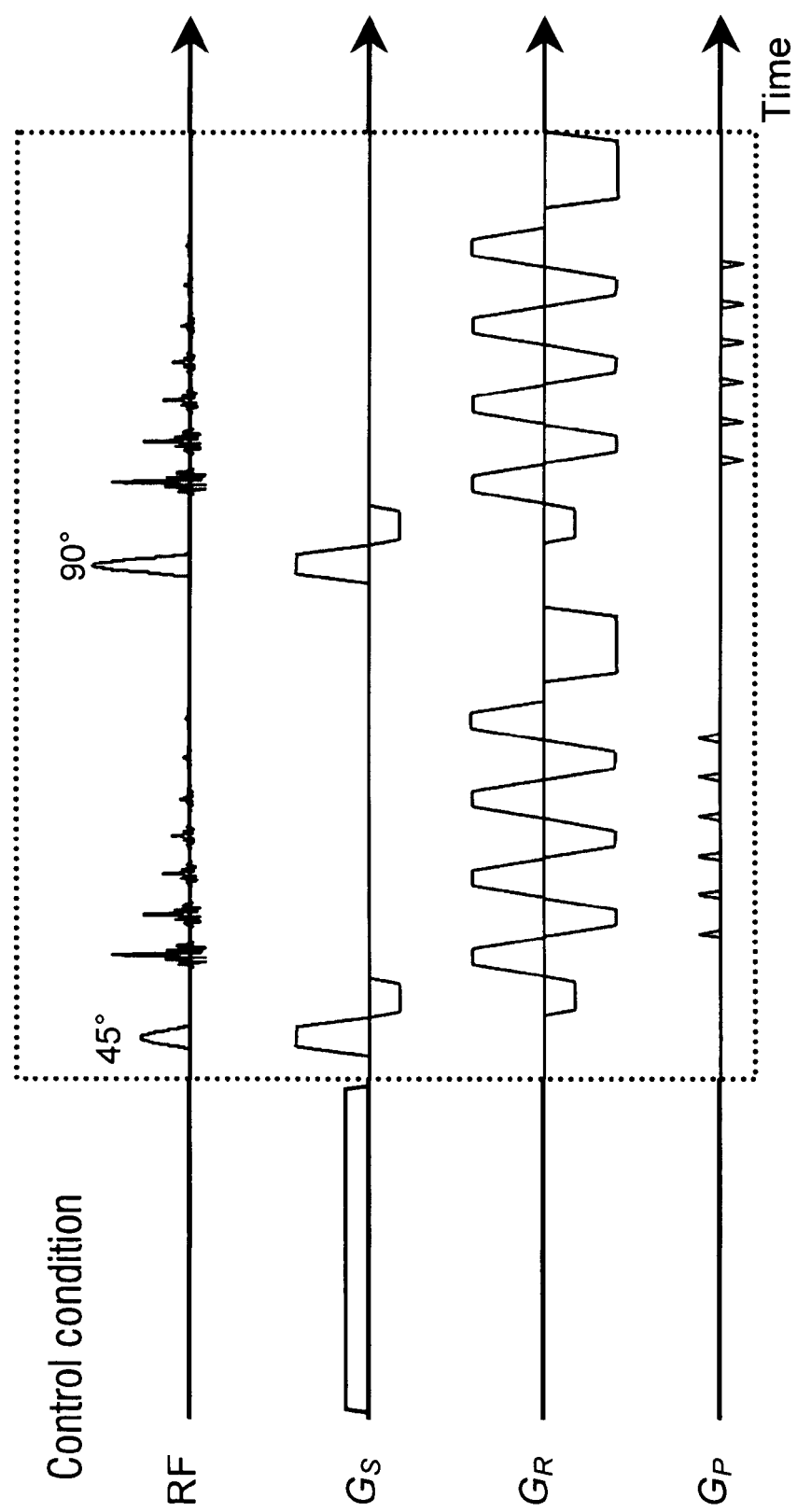
Figure 12C:
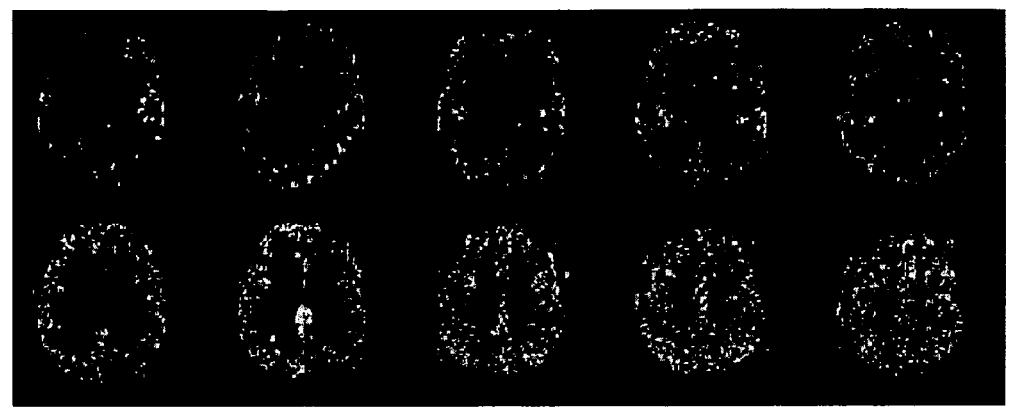

With yet a further variant of the preparation step (FIG. 12), the magnetization of arterial blood is inverted by application of a pseudo-continuous labeling RF pulse (upstream of the imaging region) in the presence of a magnetic field gradient in the direction of flow before so-called tag images are acquired using the DEPICTING scheme. FIG. 12A shows an example of a pulse sequence for this type of perfusion imaging by combining continuous arterial spin labeling and DEPICTING imaging. The pulse duration may range from 100 ms to 10 sec. The gradient lobes can appear on any arbitrary direction. A set of control images (FIG. 12B) is then acquired without inversion of the arterial blood magnetization. Quantitative information on regional blood flow is obtained after subtracting tag and control images. It is to be noted that the acquisition of control images may be obsolete if only blood-flow changes are to be detected (e.g., for detecting and mapping brain activation) during a repetitive series of acquisitions. To apply the labeling RF pulse, either the same RF coil as used for DEPICTING imaging or a separate coil may be employed [34, 35]. Examples of maps of regional cerebral blood flow (isotropic voxel dimensions of 1.5 mm) in the human brain recorded with a two-coil continuous arterial spin labeling version and DEPICTING imaging are shown in FIG. 12C. Alternatively, techniques developed for pulsed arterial spin labeling [34, 35] may also be combined with the DEPICTING scheme.

MR Imaging Device

Figure 13:
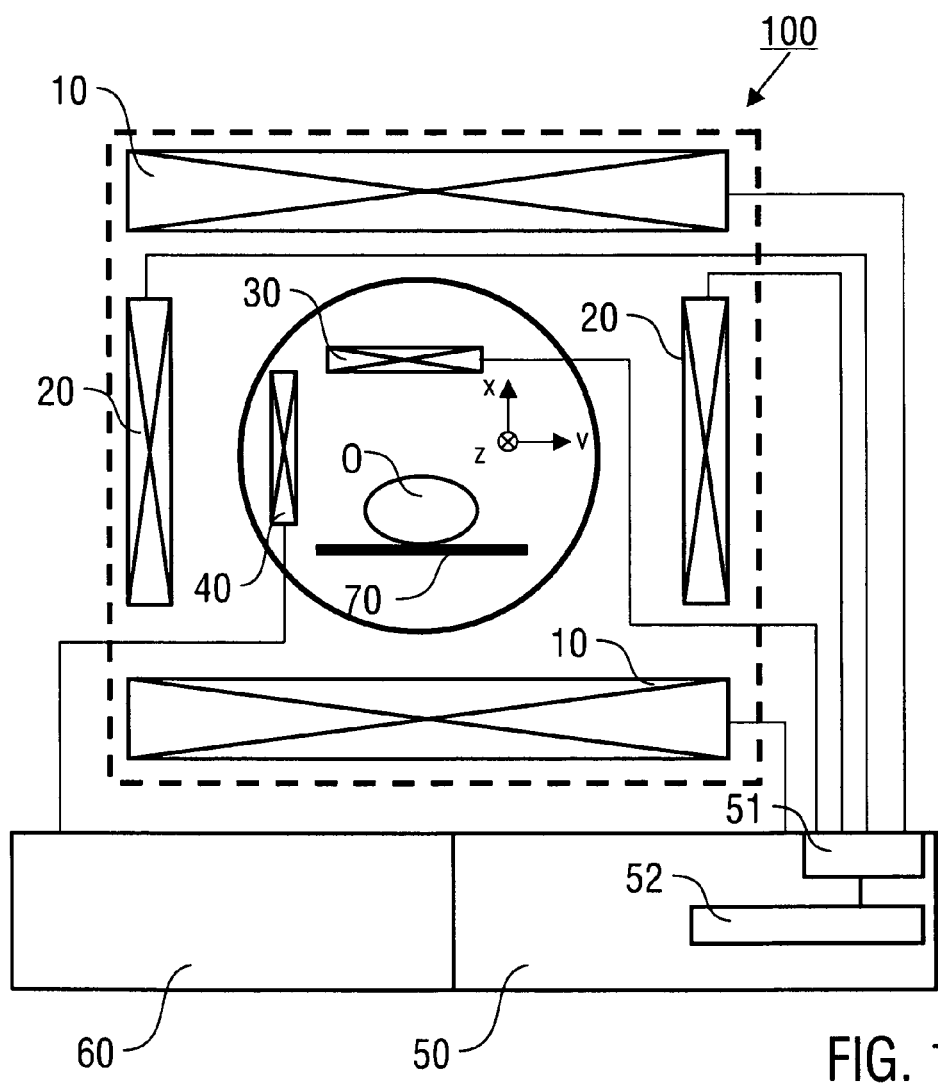
FIG. 13: a schematic illustration of a preferred embodiment of the inventive MR imaging device.

FIG. 13 schematically illustrates an embodiment of the inventive imaging device 100 including a main magnetic device 10 creating a stationary magnetic field, a magnetic field gradient device 20 generating an encoding sequence of magnetic field gradients resulting in k-space sampling in two segments along the phase-encoding direction and possibly further creating gradient waveforms for manipulating the proton magnetization, a transmitter device 30 creating excitation RF pulses and possibly refocussing RF pulses, a receiver device 40 for collection of the NMR signals created in the object O, a control device 50 controlling the magnetic field gradient device 20 and the transmitter device 30, and an image reconstructing circuit 60 reconstructing a MR image of the object O based on resonance signals collected with the receiver device 40. The components 10-40 and 60 are constructed as it is known from conventional MR scanners. In particular, the components 10 to 40 comprise coils, which are arranged around a space accommodating the object O, which is typically arranged on a carrier 70.

The control device 50 is connected with the coils of the magnetic field gradient device 20 and the transmitter device 30. The control device 50 includes an electrical circuit 51, which is adapted for creating the inventive DEPICTING pulse sequence, possibly including the preparation step. Furthermore, the control device 50 may include a setting device 52, which is adapted for selecting operation parameters of the inventive DEPICTING pulse sequence and/or the type of preparation.

The features of the invention disclosed in the above description, the drawings and the claims can be of significance both individually as well as in combination for the realization of the invention in its various embodiments.

Abbreviations and Mathematical Symbols

2D=two-dimensional; 3D=three-dimensional; BOLD=blood oxygen level dependent; DEFT=driven equilibrium Fourier transform; DEPICTING=double-shot echo-planar imaging with center-out trajectories and intrinsic navigation; EPI=echo planar imaging; FLASH=fast low-angle shot; MR=magnetic resonance; MRI=magnetic resonance imaging; RF=radiofrequency; SNR=signal-to-noise ratio

| | |
|---|---|
| $B_0$ | static external magnetic field |
| $G_R, G_P, G_S$ | amplitude of the magnetic field gradient along the direction of readout, phase encoding, and slice selection, respectively |
| $k_R, k_P, k_S$ | k-space coordinate along the direction of readout, phase encoding, and slice selection, respectively |
| $L_{centr}$ | central k-space line |
| N | number of repetitions |
| $N_{etl}$ | echo-train length |
| $N_{ol}$ | number of overscan lines |
| $N_{tiles}$ | number of tiles |
| n | number |
| S | signal amplitude |
| $S_0$ | signal amplitude at zero echo time |
| $T_1$ | longitudinal relaxation time |
| $T_2$ | transverse relaxation time |
| $T_2^*$ | effective transverse relaxation time |
| $T_{acq}$ | acquisition time |
| $T_{delay}$ | magnetization-recovery delay |
| TE | echo time |
| $TE_{eff}$ | effective echo time |
| $TR_t$ | temporal spacing of subsequently recorded tiles of k-space |
| $t_1$ | evolution time |
| $t_{del}$ | acquisition delay |
| $t_{es}$ | echo spacing |
| x, y, z | Cartesian coordinates |
| α | RF pulse flip angle |
| $α_n$ | RF pulse flip angle of the nth excitation |
| φ | rotation angle |
| τ | evolution delay |

The invention claimed is:

1. Method of magnetic resonance imaging of an object, comprising the steps of:
arranging the object in a stationary magnetic field,
subjecting the object to an excitation and encoding sequence of magnetic field gradients resulting in k-space sampling in two segments along the phase encoding direction, wherein the encoding sequence of the magnetic field gradients is selected such that the two segments in k-space are sampled along trajectories beginning with a central k-space line through a k-space center and continuing to opposite k-space borders of the two segments and
wherein one central k-space line is sampled in both of the two k-space segments,
collecting magnetic resonance signals created in the object, and
reconstructing an image of the object based on the magnetic resonance signals, wherein at least one of intersegment phase deviations and intersegment intensity deviations are corrected in both k-space segments using the magnetic resonance signals collected along the central k-space line.

2. Method according to claim 1, comprising the steps of:
averaging the magnetic resonance signals collected along the central k-space line in both k-space segments yielding common central k-space line signals, wherein
the image of the object is reconstructed from data in both k-space segments utilizing the common central k-space line signal.

3. Method according to claim 1, comprising the steps of:
conducting a separate acquisition of a multi-echo field-map scan,
providing a distribution of the stationary magnetic field across the object, and
removing off-resonance frequencies in the k-space based on the distribution of the magnetic field across the object.

4. Method according to claim 1, wherein
the two segments in k-space are sampled with a time delay relative to each other which is set to be smaller than 100 ms.

5. Method according to claim 1, comprising:
$N_{tiles}$ repetitions of the steps of k-space sampling in varying segments of k-space and collecting magnetic resonance signals, and
a plurality of $N_{tiles}-1$ images of the object are reconstructed based on the collected magnetic resonance signals, wherein
the $N_{tiles}-1$ images of the object represent a time-dependent image sequence.

6. Method according to claim 5, wherein reconstructing the images of the object comprises the step of:
pairwise combining magnetic resonance signals collected in adjacent k-space segments.

7. Method according to claim 5, wherein
excitation pulses of the excitation and encoding sequences of each k-space sampling step have identical flip angles $α_n$.

8. Method according to claim 5, wherein
excitation pulses of the excitation and encoding sequences of the n-th k-space sampling step ($1 \le n \le N_{tiles}$) have varying flip angles $α_n$ according to $$\sin α_n = \tan α_{n-1} \Rightarrow α_n$$
$$= \arctan \frac{1}{\sqrt{N_{tiles} - n}} \text{ if } n < N_{tiles} \wedge α_{N_{tiles}}$$
$$= 90°.$$

9. Method according to claim 5, wherein:
a 3 D encoding of the object is obtained by conducting each of the steps of k-space sampling in the two segments with changing a direction of the phase blips by a rotation angle φ.

10. Method according to claim 9, wherein
the rotation angle φ of the direction of the phase blips is selected with a randomized or pseudo-randomized acquisition scheme.

11. Method according to claim 1, comprising a preparation step including:
subjecting the object to at least one radiofrequency preparation pulse, and
conducting each or all of the excitation and encoding sequences of magnetic field gradients after a predetermined magnetization recovery delay time $T_{delay}$ relative to the at least one preparation pulse.

12. Method according to claim 11, including at least one of:
the at least one preparation pulse comprises a single 180° inversion pulse, a composite inversion pulse, an adiabatic inversion pulse, a sequence of RF inversion pulses designed to achieve inversion of the magnetization, or a sequence of RF pulses designed to achieve rotating the magnetization by 90° and to achieve saturation,
the at least one preparation pulse is adapted to influence the magnetization in only a predetermined region of the object, and
the object is subjected to spoiling gradients during the magnetization recovery delay time $T_{delay}$.

13. Method according to claim 1, wherein the preparation step comprises:
subjecting the object to a driven-equilibrium pulse sequence before each or all of the excitation and encoding sequences of magnetic field gradients.

14. Method according to claim 13, comprising the step of:
replacing a 180° refocusing pulse in the driven-equilibrium pulse sequence by a combination of two 90° pulses for generating a stimulated echo.

15. Method according to claim 13, comprising at least one of the steps of:
adding a pair of identical diffusion-weighting gradient lobes on either side of a refocusing pulse or a sequence of refocusing pulses of the driven-equilibrium pulse sequence, and
eddy current compensation of the diffusion-weighting driven-equilibrium pulse sequence.

16. Method according to claim 11, wherein the preparation step comprises:
a combination of two 90° pulses or another sequence of RF pulses designed to achieve rotating the magnetization by 90° followed by a variable evolution period tl for encoding of the resonance frequency and rotating the magnetization back to the longitudinal axis, and
subjecting the object to spoiling gradients.

17. Method according to claim 11, wherein the preparation step comprises:
subjecting the object to the at least one preparation pulse in the presence of a magnetic field gradient along a direction of arterial blood flow upstream of an imaging region designed to achieve partial or total inversion of magnetization of arterial blood for imaging regional blood flow.

18. Method according to claim 11, wherein:
the at least one preparation pulse is adapted to influence magnetization only in a predetermined band of resonance frequencies.

19. Imaging device for magnetic resonance imaging of an object, comprising:
a main magnetic device arranged for creating a stationary magnetic field,
a gradient device arranged for generating an encoding sequence of magnetic field gradients resulting in k-space sampling in two segments along the phase-encoding direction,
a transmitter device arranged for creating excitation pulses,
a receiver device arranged for collecting resonance signals created in the object,
a control device arranged for controlling the gradient device and the transmitter device, the control device is adapted for creating the encoding sequence of the magnetic field gradients such that the two segments in k-space are sampled along trajectories beginning with a central k-space line through the k-space center and continuing to opposite k-space borders of the two segments, and
an image reconstructing circuit arranged for reconstructing an image of the object based on the magnetic resonance signals, wherein
the control device is adapted for controlling the gradient device such that one central k-space line in both of the two k-space segments is sampled, and
the image reconstructing circuit is adapted for correcting at least one of intersegment phase deviations and intersegment intensity deviations in both k-space segments using the magnetic resonance signals collected along the central k-space line.

20. Method according to claim 1, wherein
the two segments in k-space are sampled with a time delay relative to each other which is set to be smaller than 10 ms.

* * * * *